United States Patent
Lee et al.

(10) Patent No.: US 12,520,723 B2
(45) Date of Patent: Jan. 6, 2026

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Ji-Ae Lee, Paju-si (KR); Jun-Yun Kim, Paju-si (KR); Tae-Ryang Hong, Paju-si (KR); Jeong-Eun Baek, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 612 days.

(21) Appl. No.: 17/034,438

(22) Filed: Sep. 28, 2020

(65) Prior Publication Data

US 2021/0119169 A1    Apr. 22, 2021

(30) Foreign Application Priority Data

Oct. 18, 2019 (KR) .................. 10-2019-0129776

(51) Int. Cl.
*H10K 85/60* (2023.01)
*H10K 50/11* (2023.01)
(Continued)

(52) U.S. Cl.
CPC ......... *H10K 85/6572* (2023.02); *H10K 50/11* (2023.02); *H10K 85/631* (2023.02);
(Continued)

(58) Field of Classification Search
CPC .............. H10K 50/18; H10K 85/654; H10K 2101/40; H10K 85/631; H10K 30/353;
(Continued)

(56) References Cited

U.S. PATENT DOCUMENTS

| | | | |
|---|---|---|---|
| 2016/0093823 A1* | 3/2016 | Seo | H10K 2101/40 257/40 |
| 2018/0138437 A1 | 5/2018 | Takagi | |
| 2020/0067008 A1* | 2/2020 | Mou | H10K 50/11 |

FOREIGN PATENT DOCUMENTS

| | | |
|---|---|---|
| CN | 106716668 A | 5/2017 |
| CN | 109088008 A | 12/2018 |

(Continued)

OTHER PUBLICATIONS

Ishimatsu et al. ("Solvent Effect on Thermally Activated Delayed Fluorescence by 1,2,3,5-Tetrakis(carbazol-9-yl)-4,6-dicyanobenzene") 2013 Journal of Physical Chemistry A, 117, 5607-5612 (Year: 2013).*

Search Report dated Aug. 30, 2022, issued in corresponding German Patent Application No. 102020126634.0.

(Continued)

*Primary Examiner* — Joshua Benitez Rosario
*Assistant Examiner* — Christopher A Culbert
(74) *Attorney, Agent, or Firm* — Morgan, Lewis & Bockius LLP

(57) ABSTRACT

The present disclosure relates to an organic light emitting diode (OLED) including plural light emitting material layers disposed between two electrodes and an electron blocking layer, wherein an energy level of the electron blocking layer disposed adjacently to an emitting material layer with relatively low level delayed fluorescent material and an energy level of the delayed fluorescent material are controlled, and an organic light emitting device having the diode. The OLED can lower its driving voltage and maximize its luminous efficiency and luminous lifetime.

7 Claims, 6 Drawing Sheets

(51) Int. Cl.
*H10K 50/18* (2023.01)
*H10K 101/20* (2023.01)
*H10K 101/40* (2023.01)

(52) U.S. Cl.
CPC ....... *H10K 85/654* (2023.02); *H10K 85/6576* (2023.02); *H10K 50/181* (2023.02); *H10K 2101/20* (2023.02); *H10K 2101/40* (2023.02)

(58) Field of Classification Search
CPC ............... H10K 50/11; H10K 85/6576; H10K 85/6572
See application file for complete search history.

(56) References Cited

FOREIGN PATENT DOCUMENTS

| CN | 109273614 A | 1/2019 |
|---|---|---|
| CN | 109659441 A | 4/2019 |
| KR | 10-2017-0062457 A | 6/2017 |
| KR | 10-2019-0012679 A | 2/2019 |
| KR | 10-2019-0013603 A | 2/2019 |

OTHER PUBLICATIONS

Second Office Action dated Jan. 12, 2024, issued in corresponding China Patent Application No. 202010995340.8.
Office Action issued Aug. 29, 2023 for counterpart Chinese Patent Application No. 202010995340.8 (See English Translation).
Office Action issued in corresponding Korean Intellectual Property Application No. 10-2019-0129776, Apr. 24, 2024 Note: CN109088008 cited therein is already of record.

\* cited by examiner

ORGANIC LIGHT EMITTING DIODE AND ORGANIC LIGHT EMITTING DEVICE INCLUDING THE SAME

CROSS-REFERENCE TO RELATED APPLICATIONS

This application claims the priority benefit under 35 U.S.C. § 119(a) to Korean Patent Application No. 10-2019-0129776, filed in the Republic of Korea on Oct. 18, 2019, the entire contents of which are incorporated herein by reference into the present application.

BACKGROUND

Technical Field

The present disclosure relates to an organic light emitting diode, and more specifically, to an organic light emitting diode having excellent luminous properties and an organic light emitting device including the diode.

Discussion of the Related Art

As display devices have become larger, there exists a need for a flat display device with a lower space requirement. Among the flat display devices used widely at present, organic light emitting diodes (OLEDs) are rapidly replacing liquid crystal display devices (LCDs).

In the OLED, when electrical charges are injected into an emitting material layer between an electron injection electrode (i.e., cathode) and a hole injection electrode (i.e., anode), electrical charges are recombined to form excitons, and then emit light as the recombined excitons are shifted to a stable ground state. The OLED can be formed as a thin film having a thickness less than 2000 Å and can be implement unidirectional or bidirectional images as electrode configurations. In addition, OLEDs can be formed on a flexible transparent substrate such as a plastic substrate so that OLED can implement a flexible or foldable display with ease. Moreover, the OLED can be driven at a lower voltage of 10 V or less. Besides, the OLED has relatively lower power consumption for driving compared to plasma display panels and inorganic electroluminescent devices, and the color purity of the OLED is very high. Particularly, the OLED can implement red, green and blue colors, thus it has attracted a lot of attention as a light emitting device.

Conventional fluorescent materials have shown low luminous efficiency because only the singlet excitons are involved in the luminescence process thereof. The phosphorescent materials in which triplet excitons as well as the singlet excitons are involved in the luminescence process have relatively high luminous efficiency compared to the fluorescent material. However, the metal complex as the representative phosphorescent material has too short luminous lifetime to be applicable into commercial devices.

SUMMARY

Accordingly, embodiments of the present disclosure are directed to an organic light emitting diode (OLED) and an organic light emitting device including the OLED that substantially obviates one or more of the problems due to the limitations and disadvantages of the related art.

An aspect of the present disclosure is to provide an OLED that lower its driving voltage and enhances its luminous efficiency and luminous lifetime and an organic light emitting device including the OLED.

Additional features and aspects will be set forth in the description that follows, and in part will be apparent from the description, or may be learned by practice of the inventive concepts provided herein. Other features and aspects of the inventive concept may be realized and attained by the structure particularly pointed out in the written description, or derivable therefrom, and the claims hereof as well as the appended drawings.

To achieve these and other aspects of the inventive concepts, as embodied and broadly described, a light emitting diode comprises a first electrode; a second electrode facing the first electrode; a first emitting material layer disposed between the first and second electrodes; a second emitting material layer disposed between the first emitting material layer and the second electrode; and an electron blocking layer disposed between the first electrode and the first emitting material layer, wherein each of the first emitting material layer and the second emitting material layer comprises a first compound and a second compound, wherein the second compound comprises an organic compound having the following structure of Chemical Formula 1 or Chemical Formula 3, wherein a level of the second compound in the first emitting material is lower than a level of the second compound in the second emitting material layer, and wherein a HOMO (Highest Occupied Molecular orbital) energy level ($HOMO^{DF}$) of the second compound and a HOMO energy level ($HOMO^{EBL}$) of the electron blocking layer satisfy the following relationship in Equation (1):

$$0\ eV < HOMO^{EBL} - HOMO^{DF} < 0.4\ eV \qquad (1);$$

[Chemical Formula 1]

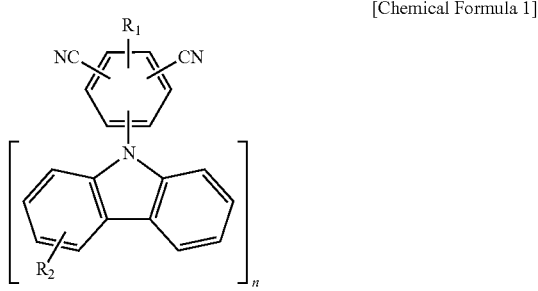

wherein each of $R_1$ and $R_2$ is independently hydrogen or $C_1$-$C_{20}$ alkyl; and n is an integer of 0 (zero) to 4;

[Chemical Formula 3]

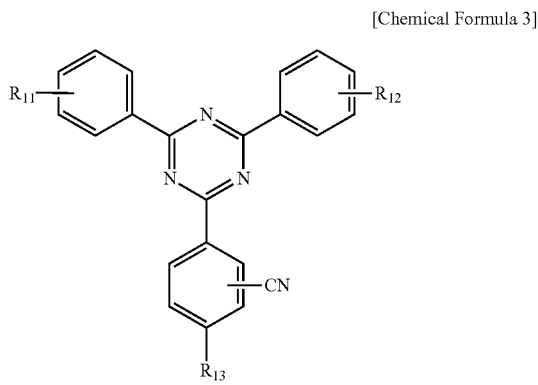

wherein each of $R_{11}$ and $R_{12}$ is independently hydrogen or $C_1$-$C_{20}$ alkyl; and $R_{13}$ is an unsubstituted or substituted $C_8$-$C_{30}$ fused hetero aromatic group, an unsubstituted or substituted $C_6$-$C_{20}$ aromatic amino group or an unsubstituted or substituted $C_3$-$C_{20}$ hetero aromatic amino group, wherein the fused hetero aromatic group includes at least one of a carbazolyl moiety, an acridinyl moiety, a phenazinyl moiety and a phenoxazinyl moiety.

In another aspect, an organic light emitting diode comprises a first electrode; a second electrode facing the first electrode; a first emitting material layer disposed between the first and second electrodes; a second emitting material layer disposed between the first emitting material layer and the second electrode; and an electron blocking layer disposed between the first electrode and the first emitting material layer, wherein each of the first emitting material layer and the second emitting material layer comprises a first compound and a second compound, wherein the second compound comprises an organic compound having the structure of Chemical Formula 1 or Chemical Formula 3, wherein a level of the second compound in the first emitting material is lower than a level of the second compound in the second emitting material layer, wherein the electron blocking layer comprises an organic compound having the following structure of Chemical Formula 5 or Chemical Formula 7, wherein the electron blocking layer comprises the organic compound having the structure of Chemical Formula 7 when the second compound is the organic compound having the structure of Chemical Formula 1, and wherein the electron blocking layer comprises the organic compound having the structure of Chemical Formula 5 when the second compound is the organic compound having the structure of Chemical Formula 3:

[Chemical Formula 5]

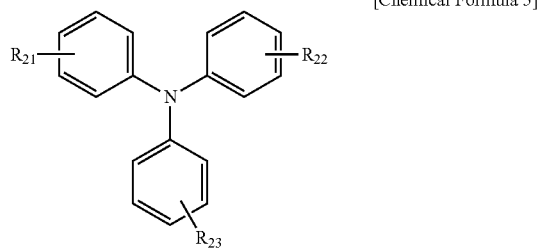

wherein each of $R_{21}$ to $R_{23}$ is independently an unsubstituted or substituted $C_6$-$C_{30}$ aromatic group or an unsubstituted or substituted $C_3$-$C_{20}$ hetero aromatic amino group;

[Chemical Formula 7]

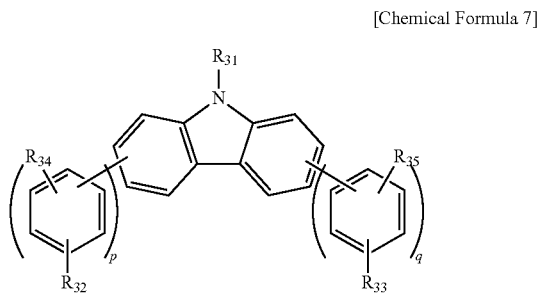

wherein $R_{31}$ is an unsubstituted or substituted $C_6$-$C_{20}$ aryl group; each of $R_{32}$ and $R_{33}$ is independently hydrogen or an unsubstituted or substituted carbazolyl group, wherein at least one of $R_{32}$ and $R_{33}$ is the carbazolyl group; each of $R_{34}$ and $R_{35}$ is independently hydrogen, an unsubstituted or substituted $C_1$-$C_{10}$ alkyl group, an unsubstituted or substituted $C_6$-$C_{20}$ aromatic group or an unsubstituted or substituted $C_3$-$C_{20}$ hetero aromatic group; and each of p and q is an integer of 0 (zero) or 1.

In still another aspect, an organic light emitting device comprises a substrate and an OLED disposed over the substrate, as described above.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference and discussion will now be made below in detail to aspects, embodiments and examples of the disclosure, some examples of which are illustrated in the accompanying drawings.

[Organic Light Emitting Device]

The present disclosure relates to an organic light emitting diode (OLED) into which plural emitting material layers each of which has different levels of delayed fluorescent material and an electron blocking layer having controlled energy levels compared to the delayed fluorescent material are applied so as to lower its driving voltage and to enhance its luminous efficiency and luminous lifetime, and an organic light emitting device having the OLED. The OLED may be applied into an organic light emitting device such as an organic light emitting display device and an organic light emitting luminescent device. As an example, a display device applying the OLED will be described.

Figure 1:
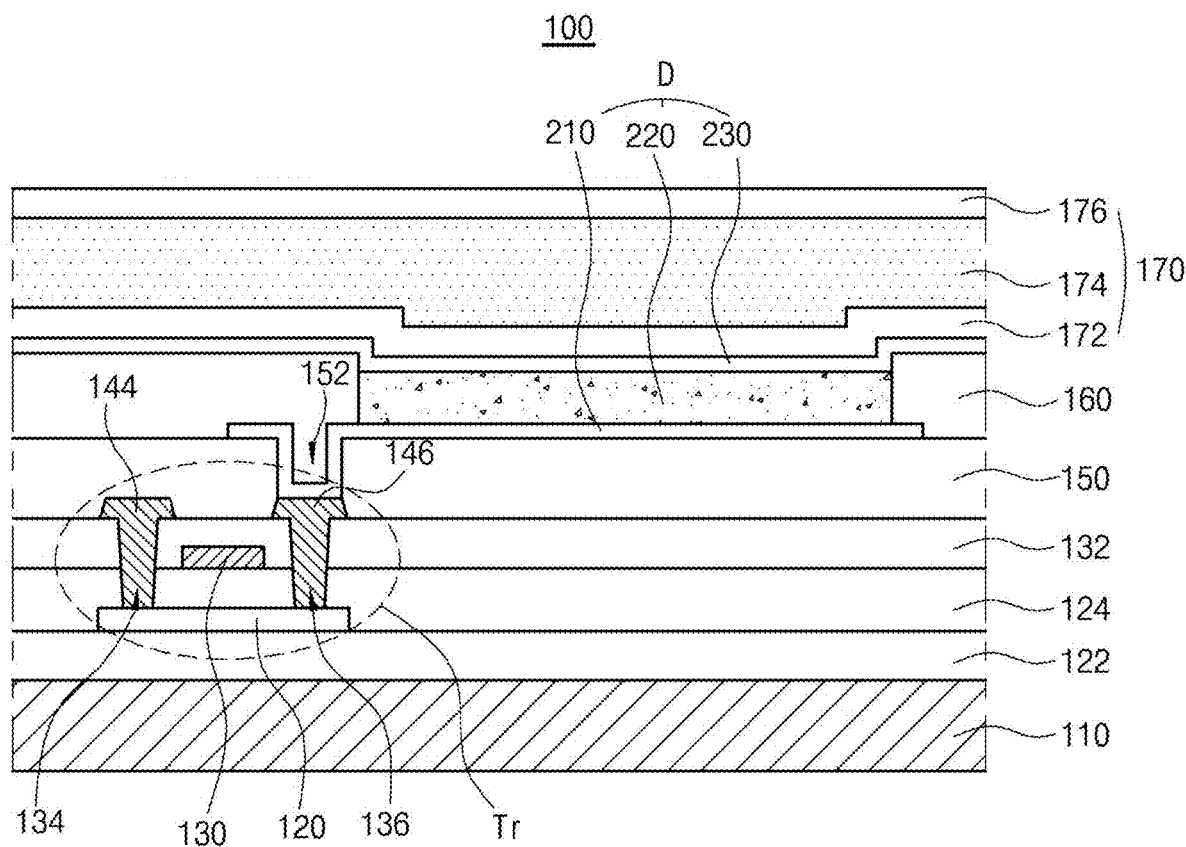
FIG. 1 is a schematic cross-sectional view illustrating an organic light emitting display device in accordance with an aspect of the present disclosure.

FIG. 1 is a schematic cross-sectional view of an organic light emitting display device of the present disclosure. As illustrated in FIG. 1, the organic light emitting display device 100 includes a substrate 110, a thin-film transistor Tr on the substrate 110, and an organic light emitting diode (OLED) D connected to the thin film transistor Tr.

The substrate 110 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the OLED D are arranged, form an array substrate.

A buffer layer 122 may be disposed over the substrate 110, and the thin film transistor Tr is disposed over the buffer layer 122. The buffer layer 122 may be omitted.

A semiconductor layer 120 is disposed over the buffer layer 122. In one exemplary aspect, the semiconductor layer 120 may include, but is not limited to, oxide semiconductor materials. In this case, a light-shield pattern may be disposed under the semiconductor layer 120, and the light-shield pattern can prevent light from being incident toward the semiconductor layer 120, and thereby, preventing the semiconductor layer 120 from being deteriorated by the light. Alternatively, the semiconductor layer 120 may include, but is not limited to, polycrystalline silicon. In this case, opposite edges of the semiconductor layer 120 may be doped with impurities.

A gate insulating layer 124 formed of an insulating material is disposed on the semiconductor layer 120. The gate insulating layer 124 may include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 may be patterned identically as the gate electrode 130.

An interlayer insulating layer 132 formed of an insulating material is disposed on the gate electrode 130 with covering over an entire surface of the substrate 110. The interlayer insulating layer 132 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over opposite sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, which are formed of conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr may have an inverted staggered structure in which a gate electrode is disposed under a semiconductor layer and a source and drain electrodes are disposed over the semiconductor layer. In this case, the semiconductor layer may comprise amorphous silicon.

A gate line and a data line, which cross each other to define a pixel region, and a switching element, which is connected to the gate line and the data line, may be further formed in the pixel region of FIG. 1. The switching element is connected to the thin film transistor Tr, which is a driving element. Besides, a power line is spaced apart in parallel from the gate line or the data line, and the thin film transistor Tr may further include a storage capacitor configured to constantly keep a voltage of the gate electrode for one frame.

In addition, the organic light emitting display device 100 may include a color filter that comprises dyes or pigments for transmitting specific wavelength light of light emitted from the OLED D. For example, the color filter can transmit light of specific wavelength such as red (R), green (G), blue (B) and/or white (W). Each of red, green, and blue color filter may be formed separately in each pixel region. In this case, the organic light emitting display device 100 can implement full-color through the color filter.

For example, when the organic light emitting display device 100 is a bottom-emission type, the color filter may be disposed on the interlayer insulating layer 132 with corresponding to the OLED D. Alternatively, when the organic light emitting display device 100 is a top-emission type, the color filter may be disposed over the OLED D, that is, a second electrode 230.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it may be spaced apart from the second semiconductor layer contact hole 136.

The OLED D includes a first electrode 210 that is disposed on the passivation layer 150 and connected to the drain electrode 146 of the thin film transistor Tr. The OLED D further includes an emissive layer 220 and a second electrode 230 each of which is disposed sequentially on the first electrode 210.

The first electrode 210 is disposed in each pixel region. The first electrode 210 may be an anode and include a conductive material having a relatively high work function value. For example, the first electrode 210 may include, but is not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the like.

In one exemplary aspect, when the organic light emitting display device 100 is a top-emission type, a reflective electrode or a reflective layer may be disposed under the first electrode 210. For example, the reflective electrode or the reflective layer may include, but are not limited to, aluminum-palladium-copper (APC) alloy. In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 may have a mono-layered structure of an emitting material layer (EML). Alternatively, the emissive layer 220 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIG. 2). In one aspect, the emissive layer 220 may have one emitting unit. Alternatively, the emissive layer 220 may have multiple emitting units to form a tandem structure.

The second electrode 230 is disposed over the substrate 110 above which the emissive layer 220 is disposed. The second electrode 230 may be disposed over a whole display area and may include a conductive material with a relatively low work function value compared to the first electrode 210. The second electrode 230 may be a cathode. For example, the second electrode 230 may include, but is not limited to, aluminum (Al), magnesium (Mg), calcium (Ca), silver (Ag), alloy thereof or combination thereof such as aluminum-magnesium alloy (Al—Mg).

In addition, an encapsulation film 170 may be disposed over the second electrode 230 in order to prevent outer moisture from penetrating into the OLED D. The encapsulation film 170 may have, but is not limited to, a laminated structure of a first inorganic insulating film 172, an organic insulating film 174 and a second inorganic insulating film 176.

Moreover, a polarizer may be attached to the encapsulation film 170 in order to decrease external light reflection. For example, the polarizer may be a circular polarizer. In addition, a cover window may be attached to the encapsulation film 170 or the polarizer. In this case, the substrate 110 and the cover window may have a flexible property, thus the organic light emitting display device 100 may be a flexible display device.

[OLED]

Figure 2:
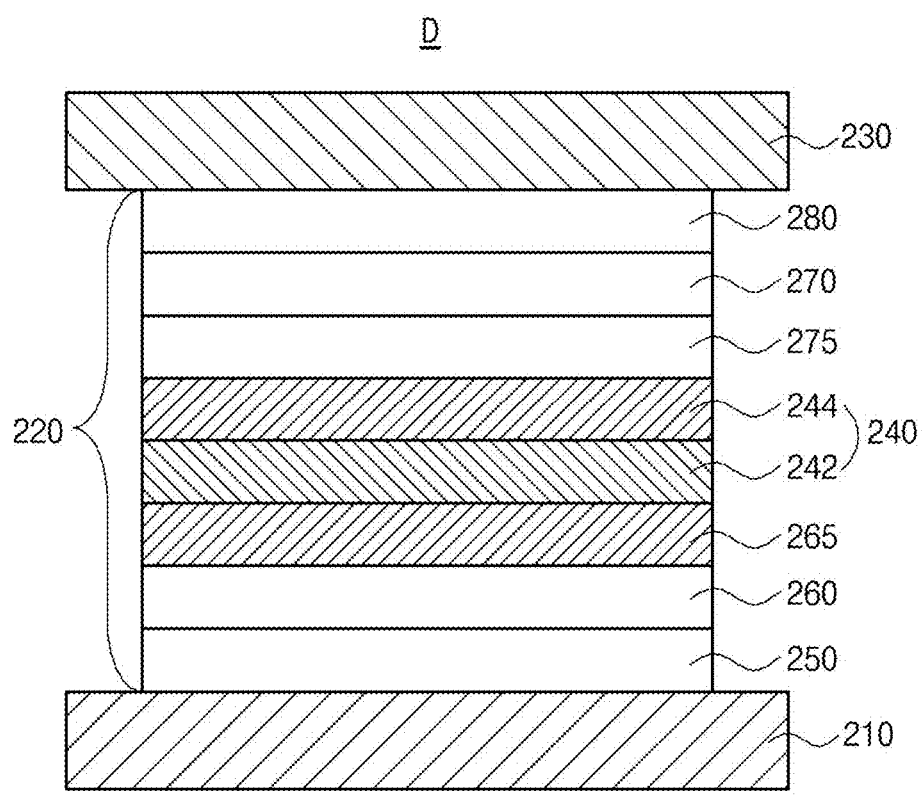
FIG. 2 is a schematic cross-sectional view illustrating an OLED in accordance with the present disclosure.

Now, we will describe the OLED in more detail. FIG. 2 is a schematic cross-sectional view illustrating an OLED in accordance with an exemplary aspect of the present disclosure. As illustrated in FIG. 2, the OLED D includes first and second electrodes 210 and 230 facing each other and an emissive layer 220 disposed between the first and second electrodes 210 and 230. In one exemplary aspect, the emissive layer 220 comprises an EML 240 disposed between the first and second electrodes 210 and 230. Also, the emissive layer 220 further comprises a HIL 250, a HTL 260 and an EBL 265 each of which is disposed sequentially between the first electrode 210 and the EML 240, an ETL 270 and an EIL 280 each of which is disposed sequentially between the EML 240 and the second electrode 230, and optionally a HBL 275 disposed between the EML 240 and the ETL 270.

The first electrode 210 may be an anode that provides a hole into the EML 240. The first electrode 210 may include, but is not limited to, a conductive material having a relatively high work function value, for example, a transparent conductive oxide (TCO). In an exemplary aspect, the first electrode 210 may include, but is not limited to, ITO, IZO, ITZO, SnO, ZnO, ICO, AZO, and the like.

The second electrode 230 may be a cathode that provides an electron into the EML 240. The second electrode 230 may include, but is not limited to, a conductive material having a relatively low work function values, i.e., a highly reflective material such as Al, Mg, Ca, Ag, alloy thereof, combination thereof, and the like.

The EML 240 comprises a first EML (EML1) 242 disposed between the EBL 265 and the HBL, and a second EML (EML2) 244 disposed between the EML1 242 and the HBL 275. Each of the EML1 242 and the EML 244 comprises a first compound and a second compound. The first compound may be a host and the second compound may be delayed fluorescent material.

The first compound in the EML1 242 and the EML2 244 may comprise, but is not limited to, 9-(3-(9H-carbazol-9-yl)phenyl)-9H-carbazole-3-carbonitrile (mCP-CN), 4,4'-bis(N-carbazolyl)-1,1'-biphenyl (CBP), 3,3'-bis(N-carbazolyl)-1,1'-biphenyl (mCBP), 1,3-Bis(carbazol-9-yl)benzene (mCP), Bis[2-(diphenylphosphino)phenyl] ether oxide (DPEPO), 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3,5'-Di(carbazol-9-yl)-[1,1-biphenyl]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), Diphenyl-4-triphenylsilylphenyl-phosphine oxide (TSPO1), 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicabazole).

Each of the EML1 242 and the EML2 244 comprises the second compound that is delayed fluorescent material. When holes and electrons meet to form exciton, singlet exciton with a paired spin state and triplet exciton with an unpaired spin state is generated in a ratio of 1:3 in theory. Since the conventional fluorescent materials can utilize only the singlet excitons, they exhibit low luminous efficiency. The phosphorescent materials can utilize the triplet excitons as well as the singlet excitons, while they show too short luminous lifetime to be applicable to commercial devices.

Delayed fluorescent material such as such as a thermally-activated delayed fluorescent (TADF) material, which can solve the problems accompanied by the conventional art fluorescent and/or phosphorescent materials, has been developed. The delayed fluorescent materials DF have very narrow energy bandgap $\Delta E_{ST}^{DF}$ between an excited singlet energy level $S_1^{DF}$ and an excited triplet energy level $T_1^{DF}$ (see, FIG. 3). Accordingly, the excitons of singlet energy level $S_1^{DF}$ as well as the excitons of triplet energy level $T_1^{DF}$ in the delayed fluorescent material DF can be transferred to an intermediate energy level state, i.e. ICT state, and then the intermediate stated excitons can be shifted to a ground state ($S_0^{DF}$; $S_1^{DF} \to ICT \leftarrow F\ T_1^{DF}$).

Since the delayed fluorescent material DF has the electron acceptor moiety spacing apart from the electron donor moiety within the molecule, it exists as a polarized state having a large dipole moment within the molecule. As the interaction between HOMO and LUMO becomes little in the state where the dipole moment is polarized, the triplet excitons as well as the singlet excitons can be converted to ICT state.

The delayed fluorescent material DF must has an energy level bandgap $\Delta E_{ST}^{DF}$ equal to or less than about 0.3 eV, for example, from about 0.05 to about 0.3 eV, between the excited singlet energy level $S_1^{DF}$ and the excited triplet energy level $T_1^{DF}$ so that exciton energy in both the excited singlet energy level $S_1^{DF}$ and the excited triplet energy level $T_1^{DF}$ can be transferred to the ICT state. The material having little energy level bandgap $\Delta E_{ST}^{DF}$ between the singlet energy level $S_1^{DF}$ and the triplet energy level $T_1^{DF}$ can exhibit common fluorescence with Inter system Crossing (ISC) in which the excitons of singlet energy level $S_1^{DF}$ can be transferred to the excitons of triplet energy level $T_1^{DF}$, as well as delayed fluorescence with Reverser Inter System Crossing (RISC) in which the excitons of triplet energy level $T_1^{DF}$ can be transferred upwardly to the excitons of singlet energy level $S_1^{DF}$, and then the exciton of singlet energy level $S_1^{DF}$ transferred from the triplet energy level $T_1^{DF}$ can be transferred to the ground state $S_0^{DF}$. In other words, 25% excitons at the excited singlet energy level $S_1^{DF}$ and 75% excitons at the excited triplet energy level $T_1^{DF}$ of the delayed fluorescent materials DF are converted to ICT state, and then the converted excitons drops to the ground state $S_0$ with luminescence. Therefore, the delayed fluorescent material may have 100% internal quantum efficiency in theory.

In one exemplary aspect, the second compound as the delayed fluorescent material DF in the EML1 242 and the EML2 244 may be carbazole-based delayed fluorescent material. The carbazole-based delayed fluorescent material may have the following structure of Chemical Formula 1:

[Chemical Formula 1]

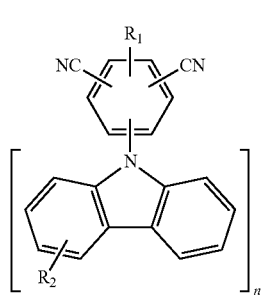

In Chemical Formula 1, each of $R_1$ and $R_2$ is independently hydrogen or $C_1$-$C_{20}$ alkyl; and n is an integer of 0 (zero) to 4, wherein Ri does not exist when n is 4.)

As used herein, the term 'unsubstituted' means that hydrogen is linked, and in this case, hydrogen comprises protium, deuterium and tritium.

As used herein, the substituent in the term "substituted" comprises, but is not limited to, unsubstituted or halogen-substituted $C_1$-$C_{20}$ alkyl, unsubstituted or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term 'hetero' in such as "a hetero aromatic ring", "a hetero cycloalkyene group", "a hetero arylene group", "a hetero aryl alkylene group", "a hetero aryl oxylene group", "a hetero cycloalkyl group", "a hetero aryl group", "a hetero aryl alkyl group", "a hetero aryloxy group", "a hetero aryl amino group" means that at least one carbon atom, for example 1-5 carbons atoms, constituting an aromatic ring or an alicyclic ring is substituted at least one hetero atom selected from the group consisting of N, O, S, P and combination thereof.

For example, the carbazole-based delayed fluorescent material may comprises anyone having the following structure of Chemical Formula 2:

[Chemical Formula 2]

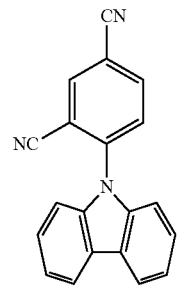
1-1

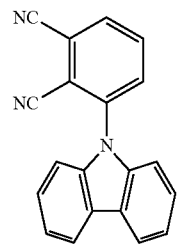
1-2

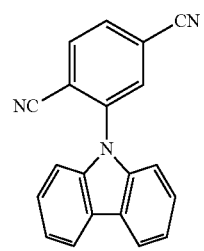
1-3

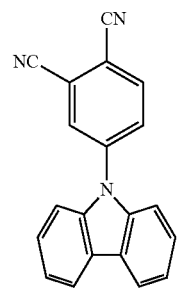
1-4

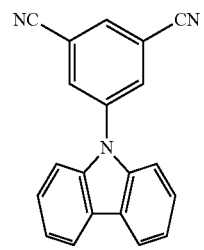
1-5

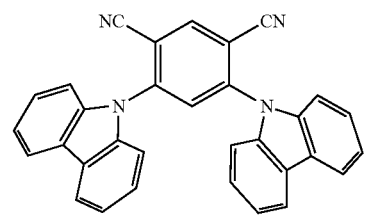
1-6

1-7 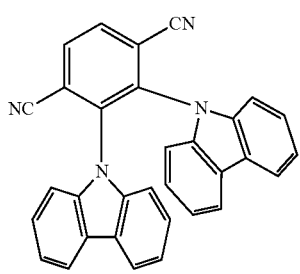
1-8 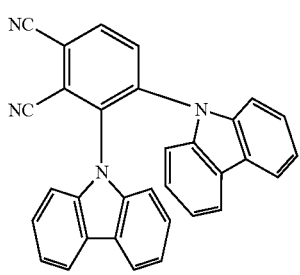
1-9 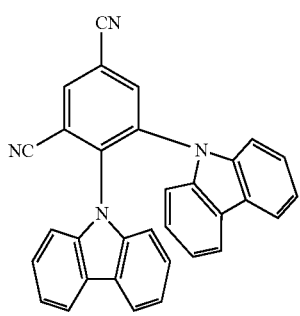
I-10 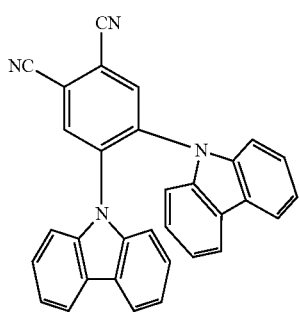
I-11 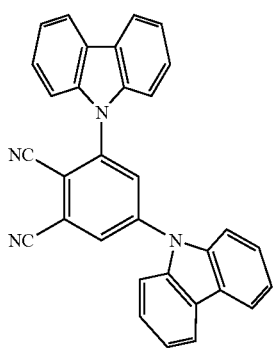
1-12 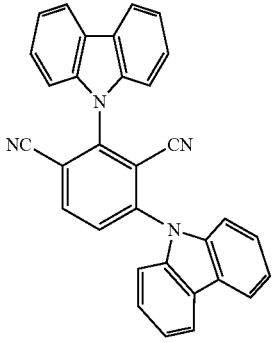
1-13 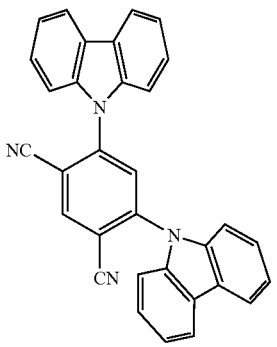
I-14 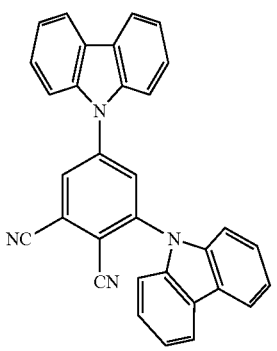
I-15 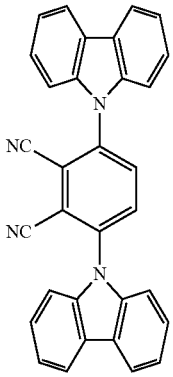

1-16 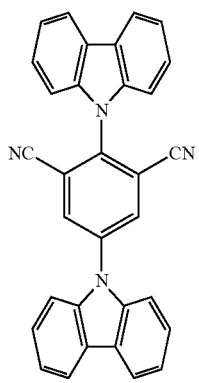
1-17 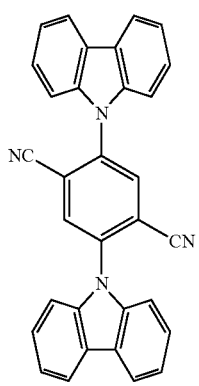
1-18 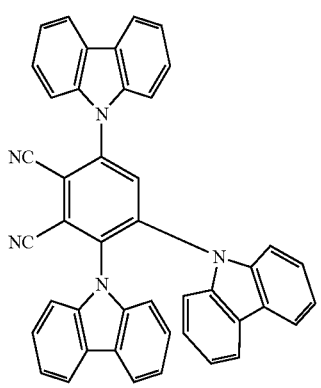
1-19 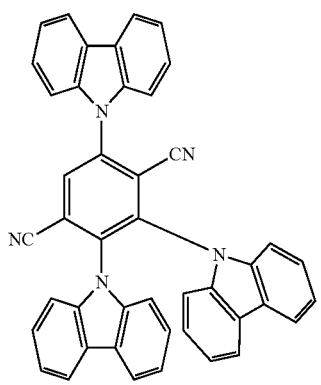
1-20 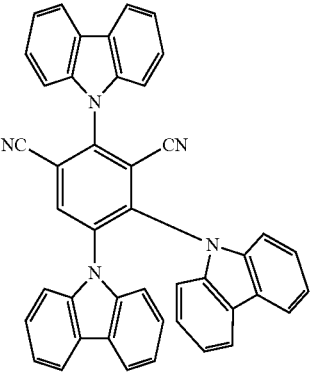
1-21 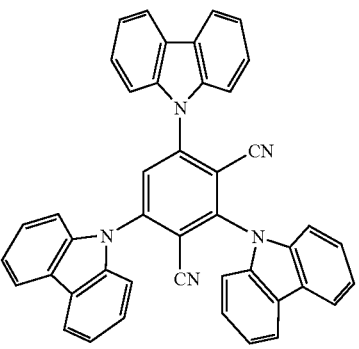
1-22 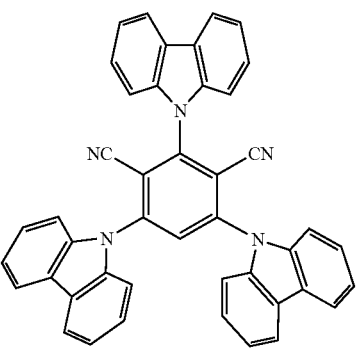
1-23 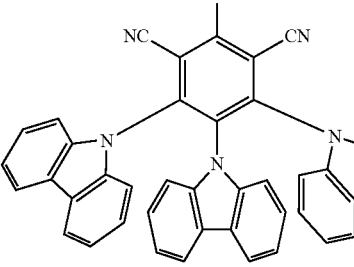
In another exemplary aspect, the second compound as the delayed fluorescent material DF in the EML1 242 and the EML2 244 may be triazine-based delayed fluorescent material. The triazine-based delayed fluorescent material may have the following structure of Chemical Formula 3:

[Chemical Formula 3]

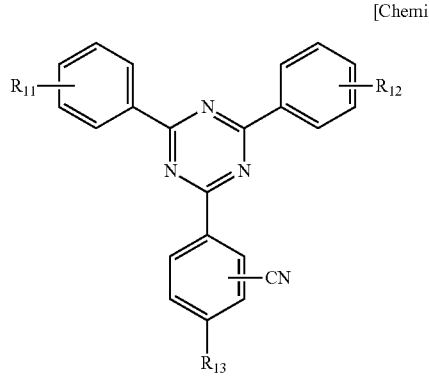

[Chemical Formula 4]

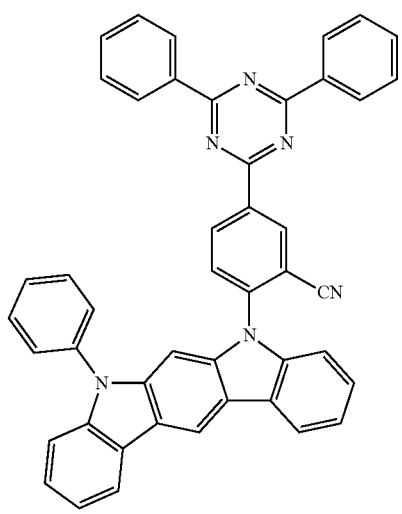

2-1

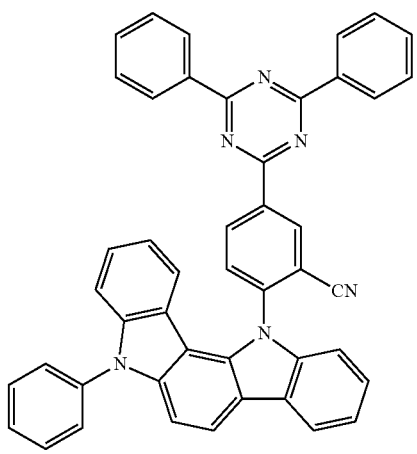

2-2

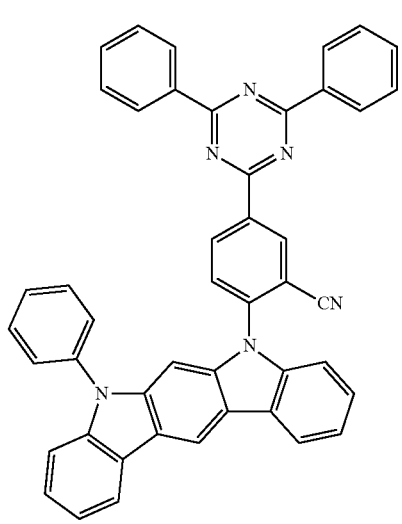

2-3

In Chemical Formula 3, each of $R_{11}$ and $R_{12}$ is independently hydrogen or $C_1$-$C_{20}$ alkyl; and $R_{13}$ is an unsubstituted or substituted $C_8$-$C_{30}$ fused hetero aromatic group, an unsubstituted or substituted $C_6$-$C_{20}$ aromatic amino group or an unsubstituted or substituted $C_3$-$C_{20}$ hetero aromatic amino group, wherein the fused hetero aromatic group includes at least one of a carbazolyl moiety, an acridinyl moiety, a phenazinyl moiety and a phenoxazinyl moiety.

As an example, each of the $C_8$-$C_{30}$ fused hetero aromatic group, the $C_6$-$C_{20}$ aromatic amino group and the $C_3$-$C_{20}$ hetero aromatic amino group may be unsubstituted or substituted with at least one group selected from a $C_1$-$C_{10}$ alkyl group, a $C_6$-$C_{30}$ aromatic group and a $C_3$-$C_{30}$ hetero aromatic group. As used herein, a $C_6$-$C_{30}$ aromatic group may comprise a $C_6$-$C_{30}$ aryl group, a $C_7$-$C_{30}$ aryl alkyl group, a $C_6$-$C_{30}$ aryloxyl group and a $C_6$-$C_{30}$ aryl amino group. As used herein a $C_3$-$C_{30}$ hetero aromatic group may comprise a $C_3$-$C_{30}$ hetero aryl group, a $C_4$-$C_{30}$ hetero aryl alkyl group, a $C_3$-$C_{30}$ hetero aryloxyl group and a $C_3$-$C_{30}$ hetero aryl amino group.

As an example, the fused hetero aromatic group may comprise a carbazolyl moiety, an acridinyl moiety, a phenazinyl moiety and a phenoxazinyl moiety. Also, the fused hetero aromatic group may further comprise aromatic or hetero aromatic rings such as a benzene ring, a naphthalene ring, an indene ring, a pyridine ring, an indole ring, a furan ring, a benzo-furan ring, a dibenzo-furan ring, a thiophene ring, a benzo-thiophene ring and/or a dibenzothiophene ring fused to those moieties. For example, the fused hetero aromatic group may comprise an unsubstituted or substituted indolo-carbazolyl moiety, an unsubstituted or substituted benzo-thieno-carbazolyl moiety. For example, the triazine-based delayed fluorescent material having the structure of Chemical Formula 3 may comprise anyone having the following structure of Chemical Formula 4:

2-4
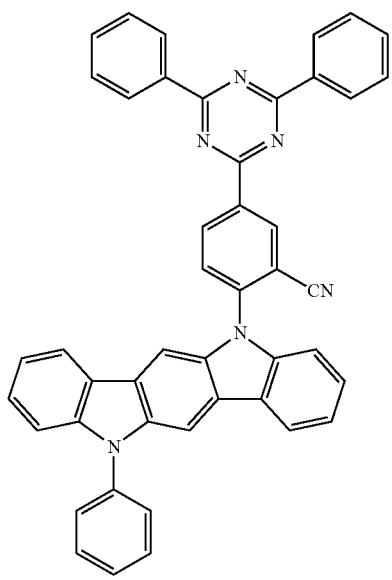
2-5
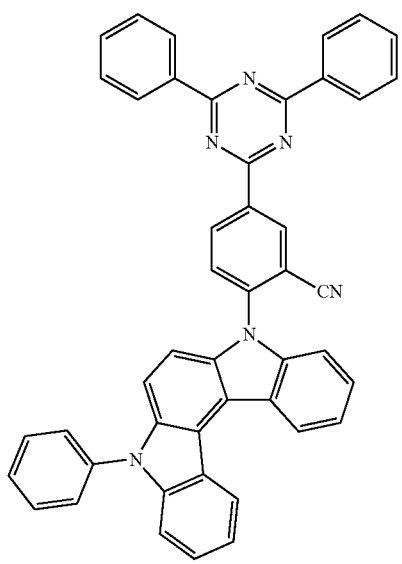
2-6
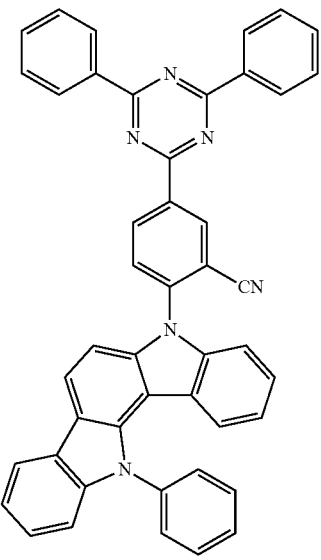
2-7
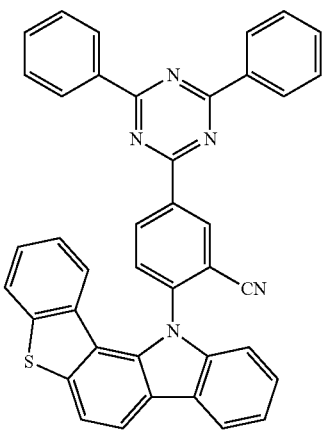
2-8

2-9
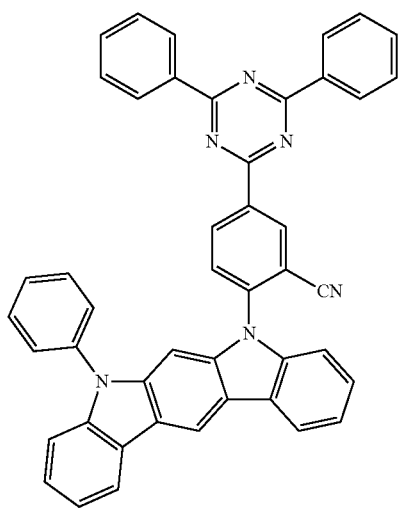
2-10
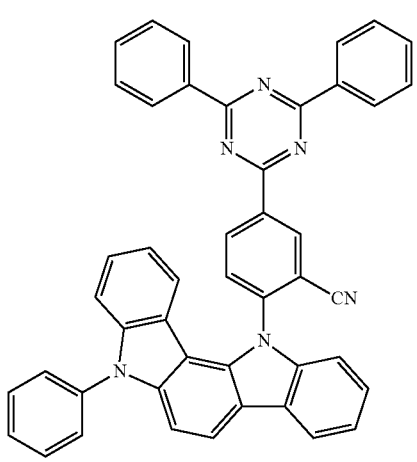
2-11
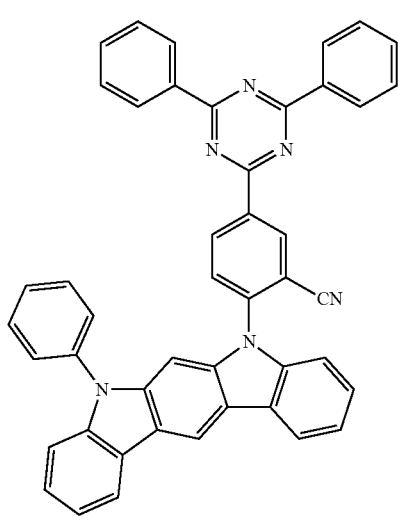
2-12
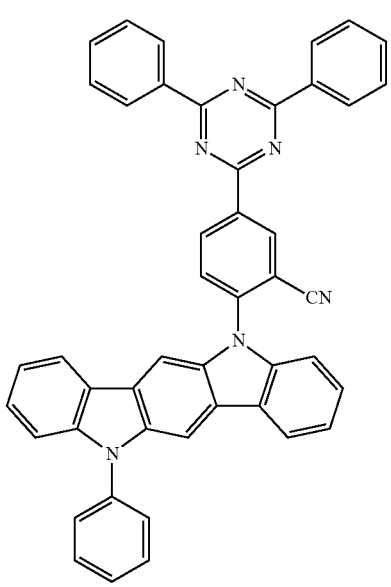
2-13
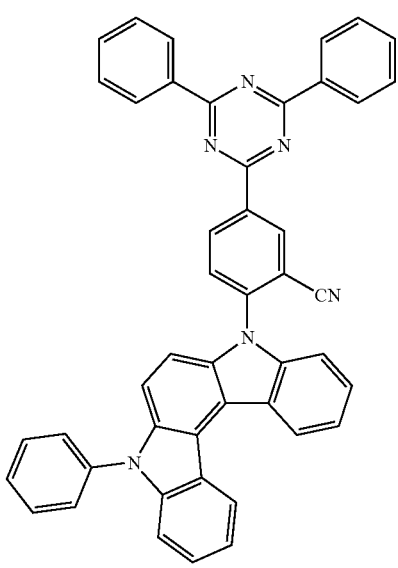

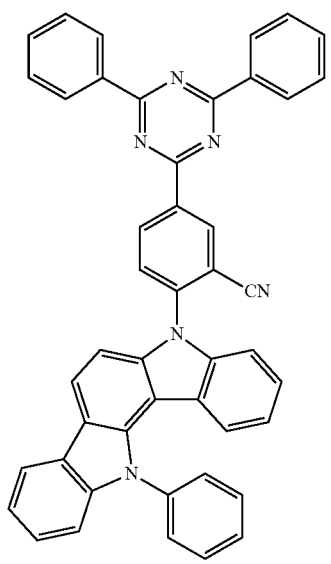
2-14
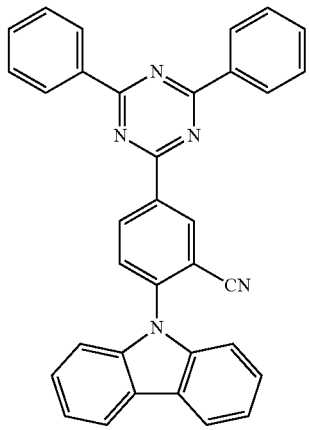
2-17
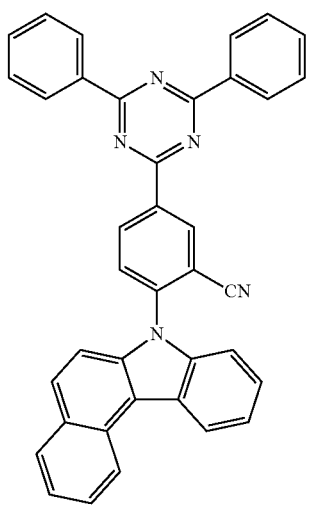
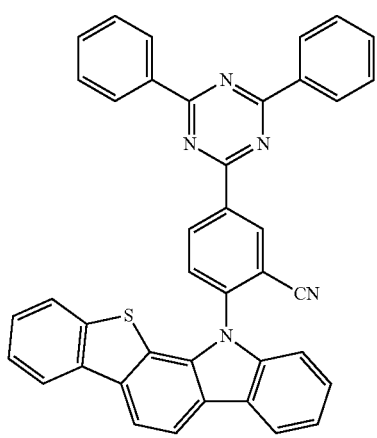
2-15
2-18
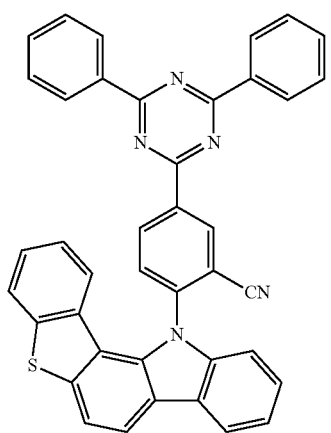
2-16
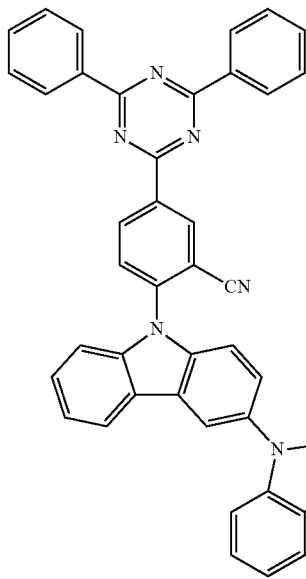
2-19

-continued 2-20

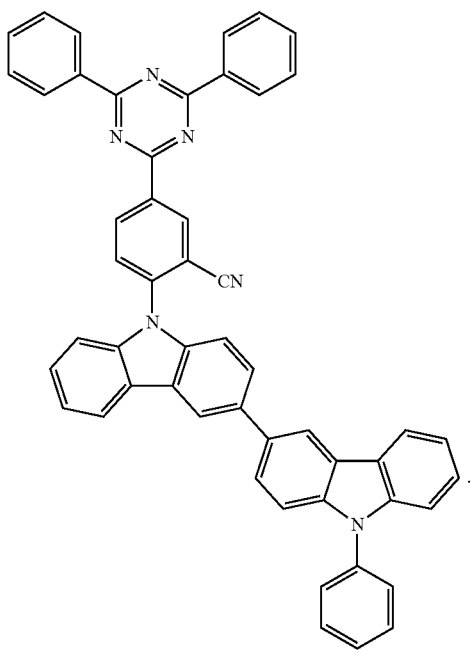

In one exemplary aspect, the level of the second compound DF in the EML1 242 that is disposed adjacently to the EBL 265 may be lower than the level of the second compound DF in the EML2 244 that is disposed adjacently to the HBL 275.

As an example, the triazine-based delayed fluorescent material having the structure of Chemical Formulae 3 and 4 has relatively high electron transporting property compared to hole transporting property. When the level of the second compound DF in the EML1 242 is higher than or equal to the level of the second compound DF in the EML2 244, electrons are injected into the EML1 242 faster than holes. In this case, recombination zone among holes and electrons are formed at an interface between the EBL 264 and the EML1 242, which results in increasing driving voltage in the OLED D without improving its luminous efficiency and luminous lifetime.

In one exemplary aspect, the contents of the second compound DF in the EML1 242 may be about 5 wt % to about 30 wt %, while the contents of the second compound DF in the EML2 244 may be about 40 wt % to about 50 wt %, but the present disclosure is not limited thereto. When the contents of the second compound DF in the EML1 242 is more than about 30 wt % and/or the contents of the second compound DF in the EML2 244 is more than about 50 wt %, electrons are trapped in the EML2 244 and excitons are not generated efficiently.

In another exemplary aspect, the thickness of the EML1 242 may be thinner than the thickness of the EML2 244. For example, the EML1 242 may have a thickness of, but is not limited to, about 3 nm to about 10 nm, for example, about 3 nm to about 5 nm, and the EML2 244 may have a thickness of, but is not limited to, about 20 nm to about 50 nm, for example, about 30 nm to about 50 nm. It is possible to induce the recombination zone among holes and electrons to be formed at a central region of the EML 240, for example at the EML2 244 by adjusting the thicknesses of the EML1 242 and EML2 244 each of which includes different levels of the second compound DF.

As described above, the delayed fluorescent material can implement maximum 100% internal quantum efficiency in theory as the conventional phosphorescent materials including heavy metals. The host for realizing delayed fluorescence should induce the triplet excitons at the dopant to be involved in the luminescence process without quenching or non-radiative recombination. To this end, the energy levels between the host and the delayed fluorescent materials should be adjusted.

Figure 3:
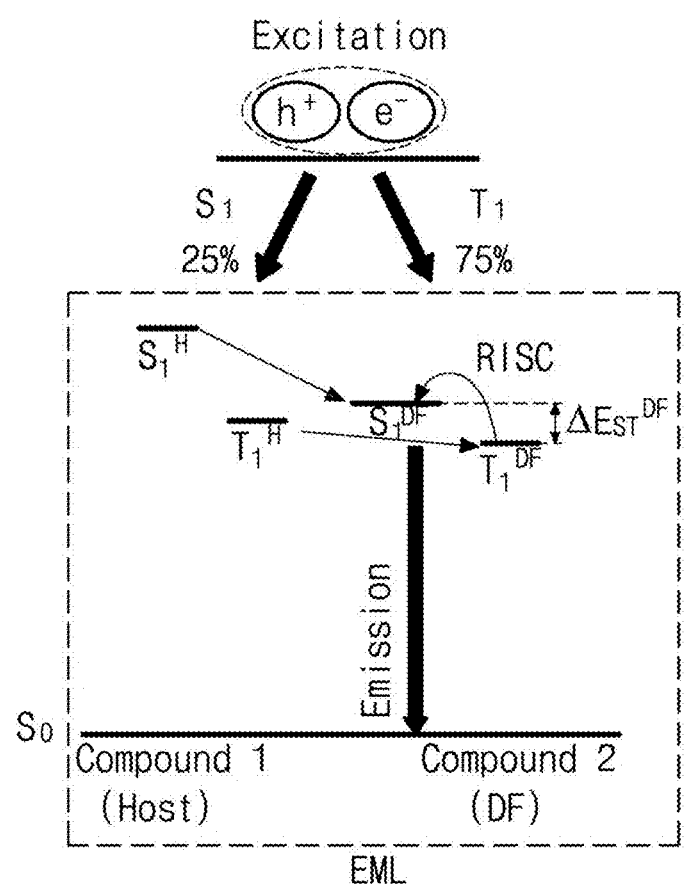
FIG. 3 is a schematic diagram illustrating luminous mechanism by singlet energy levels and triplet energy levels among luminous materials in accordance with the present disclosure.

FIG. 3 is a schematic diagram illustrating luminous mechanism by energy level bandgap among luminous materials in accordance with the present disclosure. As illustrated in FIG. 3, each of the excited singlet energy level $S_1^H$ and the excited triplet energy level $T_1^H$ of the first compound, which can be the host in the EML 240, is higher than each of the excited singlet energy level $S_1^{DF}$ and the excited triplet energy level $T_1^H$ of the second compound DF having the delayed fluorescent property, respectively. As an example, the excited triplet energy level $T_1^H$ of the first compound H may be higher than the excited triplet energy level $T_1^{DF}$ of the third compound DF by at least about 0.2 eV, preferably at least about 0.3 eV, and more preferably at least about 0.5 eV.

When the excited triplet energy level $T_1^H$ and/or the excited singlet energy level $T_1^H$ of the first compound is not high enough than the excited triplet energy level $T_1^{DF}$ and/or the excited singlet energy level $S_1^{DF}$ of the second compound DF, the triplet state exciton energy of the second compound DF may be reversely transferred to the excited triplet energy level $T_1^H$ of the first compound. In this case, the triplet exciton reversely transferred to the first compound where the triplet exciton cannot be emitted is quenched as non-emission so that the triplet exciton energy of the second compound DF having the delayed fluorescent property cannot contribute to luminescence. As an example, the second compound DF having the delayed fluorescent property may have the energy level bandgap $\Delta E_{ST}^{DF}$ between the excited singlet energy level $S_1^{DF}$ and the excited triplet energy level $T_1^{DF}$ equal to or less than about 0.3 eV, for example between about 0.05 eV and about 0.3 eV.

Figure 6:
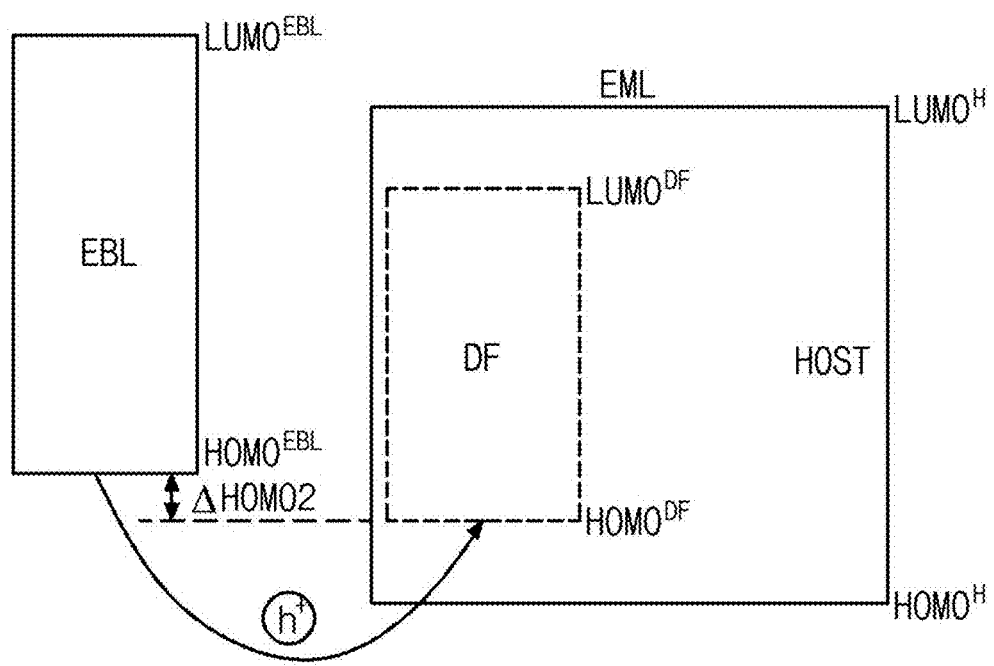
FIG. 6 is a schematic diagram illustrating charge injection without any charge transporting issues or charge trap issues by controlling the HOMO energy level bandgap between the EML and the EBL in the present disclosure.

Also, it is preferable that an energy level bandgap (|HOMO$^H$−HOMO$^{DF}$|) between the HOMO energy level (HOMO$^H$) of the first compound and the HOMO energy level (HOMO$^{DF}$) of the second compound, or an energy level bandgap (|LUMO$^H$−LUMO$^{DF}$|) between the LUMO energy level (LUMO$^H$) of the first compound and the LUMO energy level (LUMO$^{DF}$) of the second compound may be equal to or less than about 0.5 eV, for example, between about 0.1 eV to about 0.5 eV (see, FIG. 6). In this case, the charges can be transported efficiently from the first compound as the host to the second compound as the delayed fluorescent material and thereby enhancing the ultimate luminous efficiency in the EML 240.

Returning to FIG. 2, The HIL 250 is disposed between the first electrode 210 and the HTL 260 and improves an interface property between the inorganic first electrode 210 and the organic HTL 260. In one exemplary aspect, the HIL 250 may include, but is not limited to, 4,4',4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N=-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11- hexacarbonitrile; HAT-CN), 1,3,5-tris[4-(diphenylamino) phenyl]benzene (TDAPB), poly(3,4-ethylenedioxythiophene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 250 may be omitted in compliance with a structure of the OLED D.

The HTL 260 is disposed adjacently to the EML 240 between the first electrode 210 and the EML 240. In one exemplary aspect, the HTL 260 may include, but is not limited to, N,N'-Diphenyl-N,N'-bis(3-methylphenyl)-1,1'-biphenyl-4,4'-diamine (TPD), NPB, CBP, Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), Di-[4-(N,N-di-p-tolyl-amino)-phenyl]cyclohexane (TAPC), 3,5-di(9H-carbazol-9-yl)-N,N-diphenylamine (DCDPA), N-(biphenyl-4-yl)-9,9-dimethyl-N-(4-(9-phenyl-9H-carbazol-3-yl) phenyl)-9H-fluoren-2-amine and/or N-(biphenyl-4-yl)-N-(4-(9-phenyl-9H-carbazol-3-yl)phenyl)biphenyl-4-amine.

The ETL 270 and the EIL 280 may be disposed sequentially between the EML 240 and the second electrode 230. The ETL 270 includes a material having high electron mobility so as to provide electrons stably with the EML 240 by fast electron transportation. In one exemplary aspect, the ETL 270 may comprise, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 270 may comprise, but is not limited to, tris-(8-hydroxyquinoline aluminum (Alq$_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ) and/or TSPO1.

The EIL 280 is disposed between the second electrode 230 and the ETL 270, and can improve physical properties of the second electrode 230 and therefore, can enhance the lifetime of the OLED D. In one exemplary aspect, the EIL 280 may comprise, but is not limited to, an alkali halide such as LiF, CsF, NaF, BaF$_2$ and the like, and/or an organic metal compound such as lithium quinolate, lithium benzoate, sodium stearate, and the like.

When holes are transferred to the second electrode 230 via the EML 240 and/or electrons are transferred to the first electrode 210 via the EML 240, the OLED D may have short lifetime and reduced luminous efficiency. In order to prevent these phenomena, the OLED D in accordance with the present disclosure comprises the EBL 265 disposed between the HTL 260 and the EML 240.

In addition, the OLED D may further include the HBL 275 as a second exciton blocking layer between the EML 240 and the ETL 270 so that holes cannot be transferred from the EML 240 to the ETL 270. In one exemplary aspect, the HBL 275 may comprise, but is not limited to, oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 270.

For example, the HBL 275 may comprise a compound having a relatively low HOMO energy level compared to the luminescent materials in EML 240. The HBL 275 may comprise, but is not limited to, mCBP, BCP, BAlq, Alq$_3$, PBD, spiro-PBD, Liq, Bis-4,5-(3,5-di-3-pyridylphenyl)-2-methylpyrimidine (B3PYMPM), DPEPO, TSPO1 and combination thereof.

As described above, the EBL 264 is disposed between the HTL 260 and the EML 240. As an example, a HOMO (Highest Occupied Molecular orbital) energy level $HOMO^{DF}$ of the second compound DF in the EML1 242 and the EML2 244 and a HOMO energy level $HOMO^{EBL}$ of the EBL 265 may satisfy the following relationship in Equation (1):

$$0 \text{ eV} < HOMO^{EBL} - HOMO^{DF} < 0.4 \text{ eV} \quad (1);$$

When the HOMO energy levels between the EBL 265 and the second delayed fluorescent material DF satisfy the relationship in Equation (1), holes can be transported and injected efficiently from the EBL 265 to the EML 240, and the recombination zone among holes and electrons may be formed at the central region in the EML 240. As an example, the HOMO energy level $HOMO^{DF}$ of the second compound DF in the EML 240 may be deeper up to about 0.3 eV compared to the HOMO energy level $HOMO^{EBL}$ of the EBL 265.

In one exemplary aspect, the EBL 260 may comprise an organic compound having a (hetero) aromatic amino group. Such an organic compound having the (hetero) aromatic amino group may have the following structure of Chemical Formula 5:

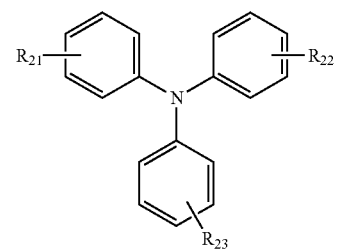

[Chemical Formula 5]

In Chemical Formula 5, each of $R_{21}$ to $R_{23}$ is independently an unsubstituted or substituted $C_6$-$C_{30}$ aromatic group or an unsubstituted or substituted $C_3$-$C_{20}$ hetero aromatic amino group.

As an example, each of the $C_6$-$C_{30}$ aromatic group or the $C_3$-$C_{20}$ hetero aromatic amino group in $R_{21}$ to $R_{23}$ may be unsubstituted or substituted with at least one group selected from a $C_1$-$C_{10}$ alkyl group, a $C_6$-$C_{30}$ aryl group and a $C_3$-$C_{30}$ hetero aryl group. More particularly, the organic compound including the (hetero) aromatic amino group of Chemical Formula 5 may comprise any organic compound having the following structure of Chemical Formula 6:

[Chemical Formula 6]
3-1
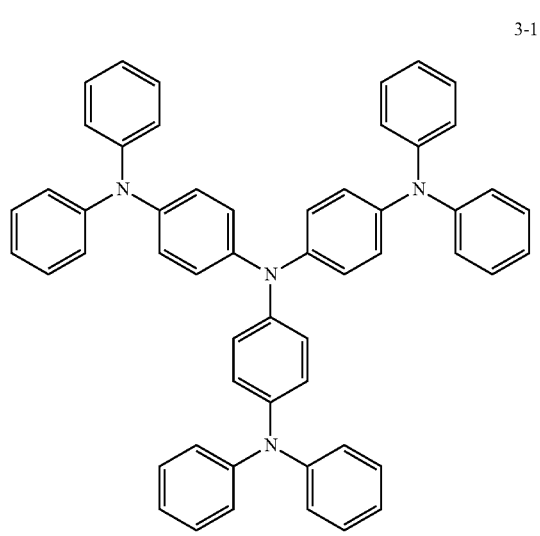
3-4
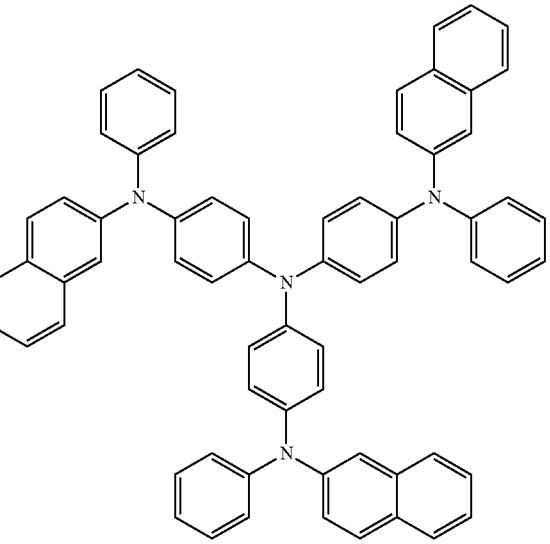
3-2
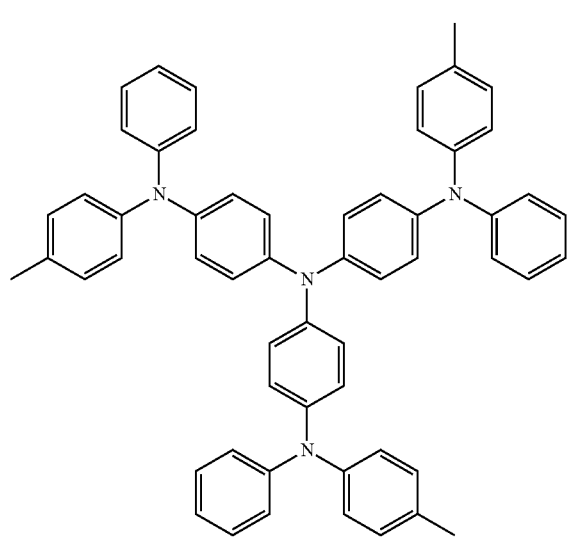
3-5
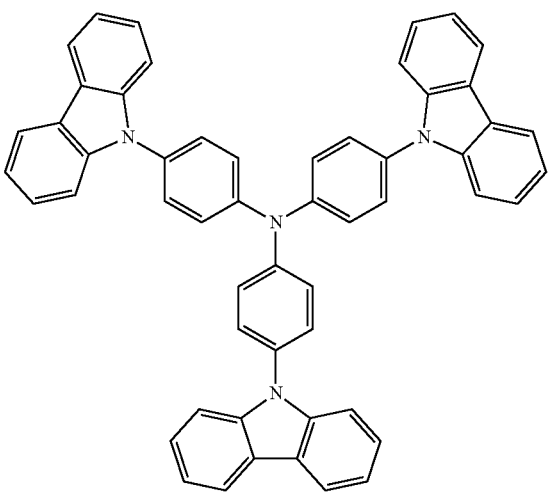
3-3
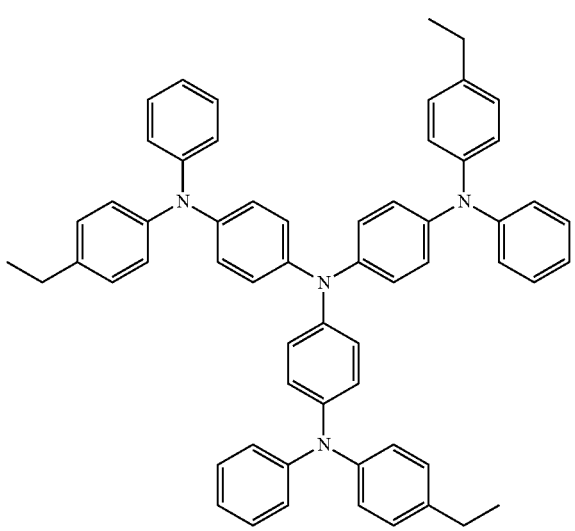
3-6
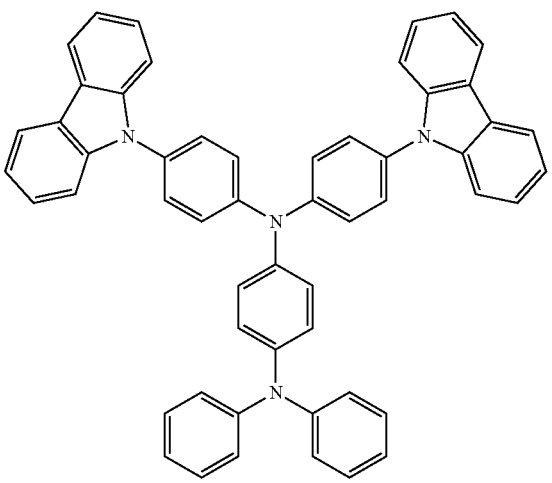

3-7
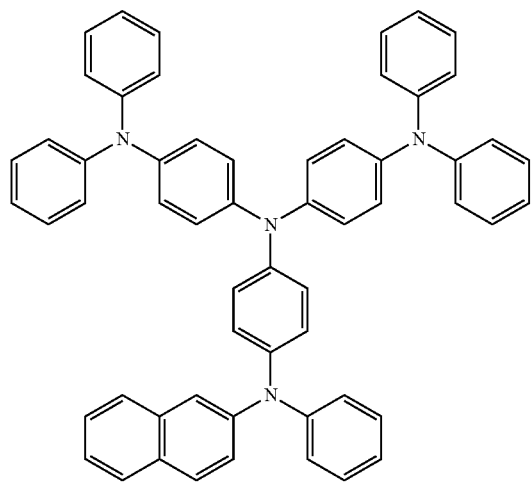
3-10
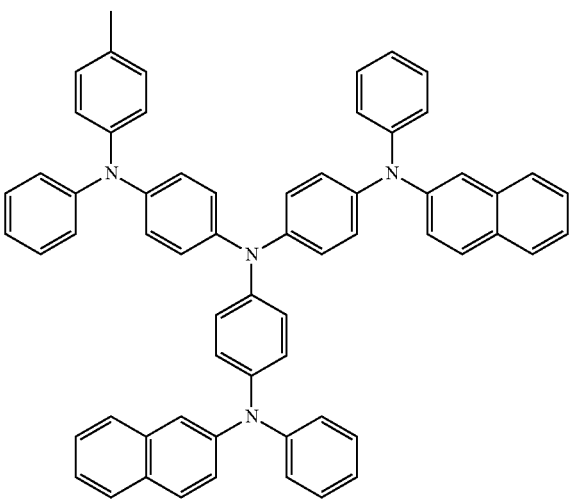
3-8
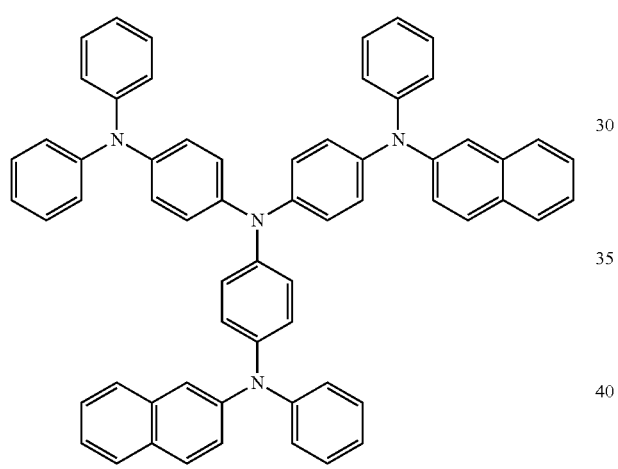
3-11
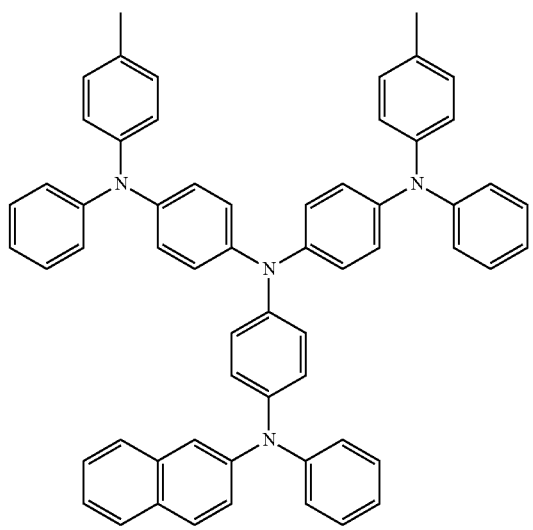
3-9
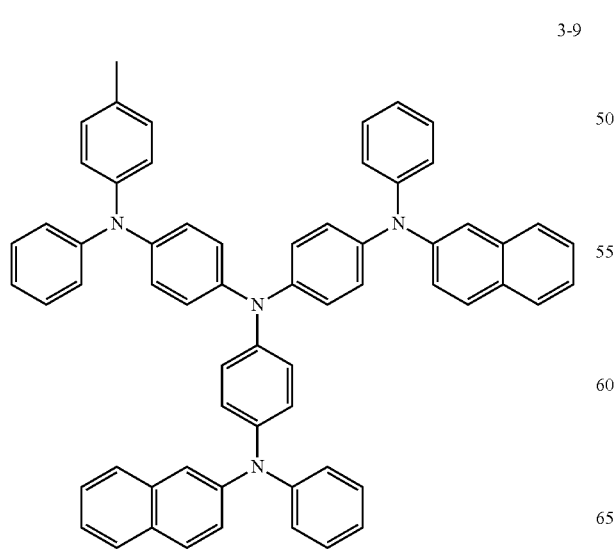
3-12
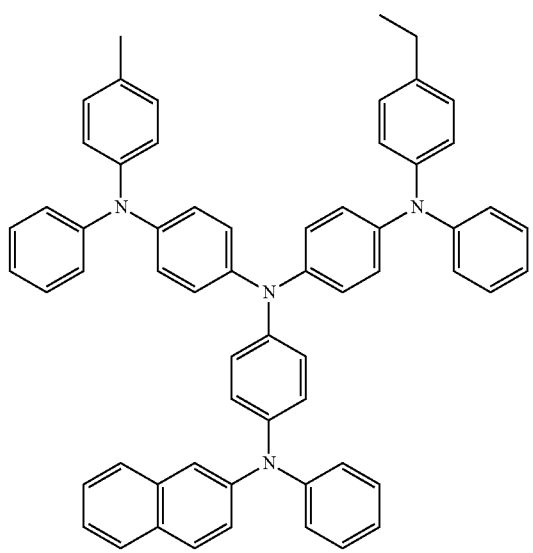

3-13
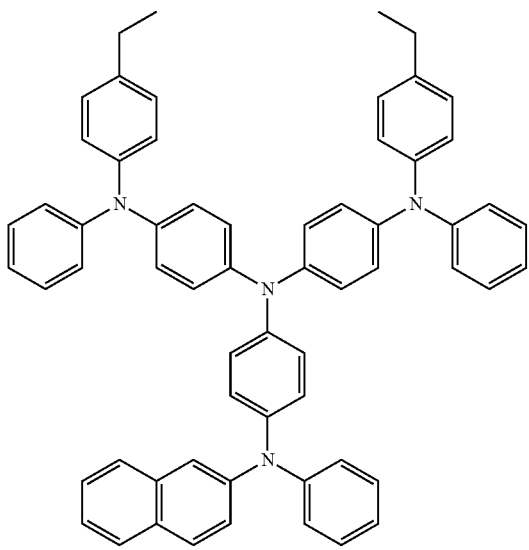
3-14
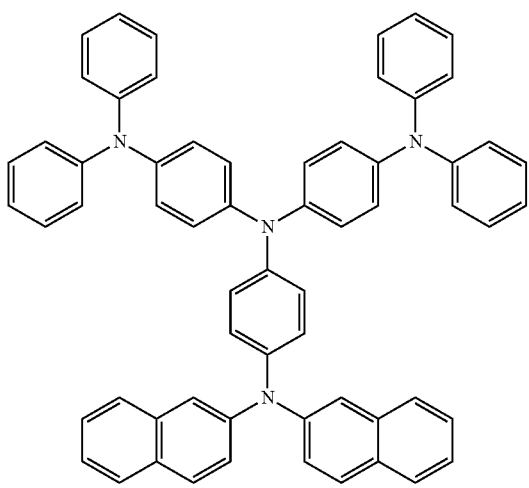
3-15
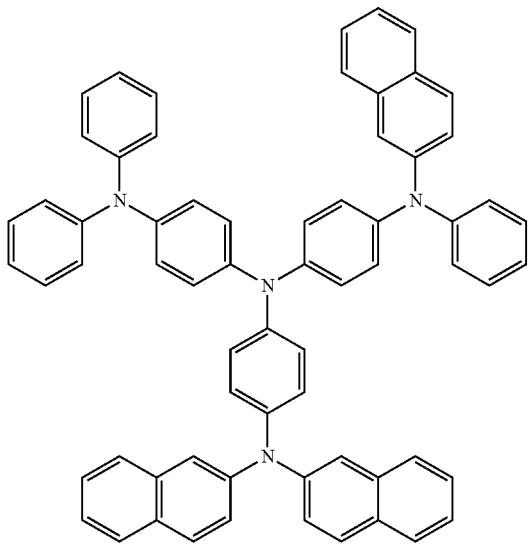
3-16
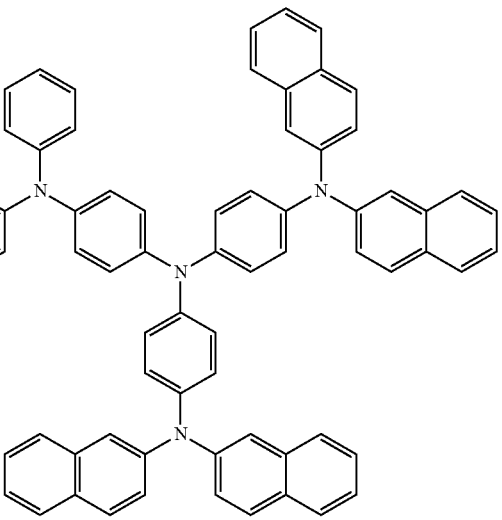
3-17
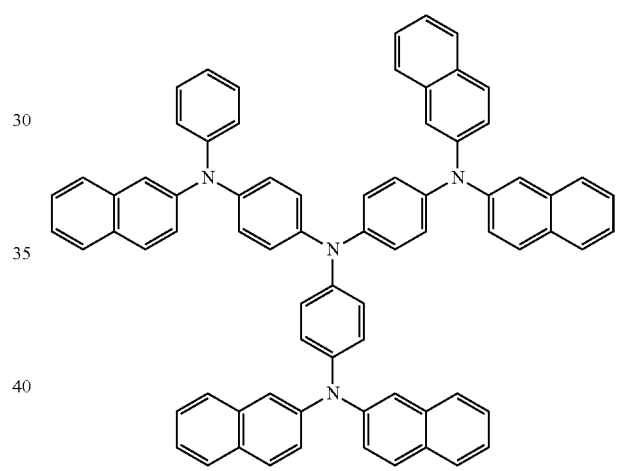
3-18
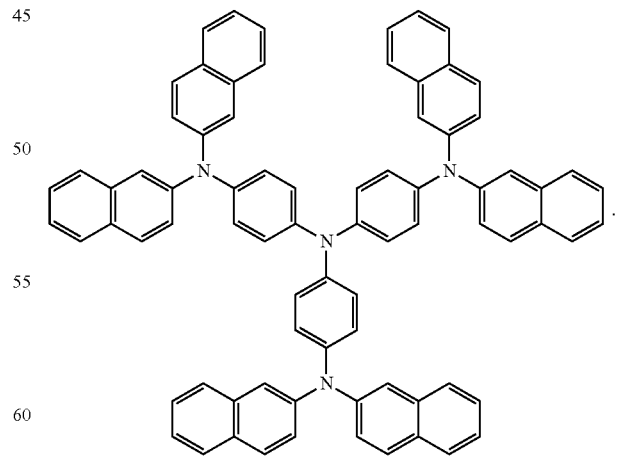
In another exemplary aspect, the EBL 265 may comprise a carbazole-based organic compound. The carbazole-based organic compound in the EBL 265 may have the following structure of Chemical Formula 7:

[Chemical Formula 7]

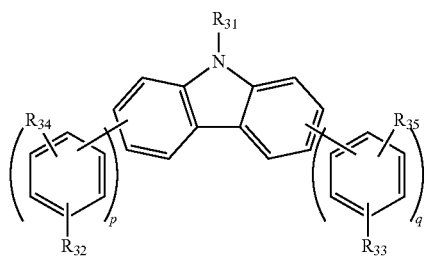

In Chemical Formula 7, $R_{31}$ is an unsubstituted or substituted $C_6$-$C_{20}$ aryl group; each of $R_{32}$ and $R_{33}$ is independently hydrogen or an unsubstituted or substituted carbazolyl group, wherein at least one of $R_{32}$ and $R_{33}$ is the carbazolyl group; each of $R_{34}$ and $R_{35}$ is independently hydrogen, an unsubstituted or substituted $C_1$-$C_{10}$ alkyl group, an unsubstituted or substituted $C_6$-$C_{20}$ aromatic group or an unsubstituted or substituted $C_3$-$C_{20}$ hetero aromatic group; and each of p and q is an integer of 0 (zero) or 1.

As an example, the carbazolyl group in $R_{32}$ may be unsubstituted or substituted with at least one group selected from a $C_1$-$C_{10}$ alkyl group, a $C_6$-$C_{30}$ aryl group and a $C_3$-$C_{30}$ hetero aryl group. More particularly, the carbazole-based organic compound in the EBL 265 of Chemical Formula 7 may comprise any organic compound having the following structure of Chemical Formula 8:

[Chemical Formula 8]

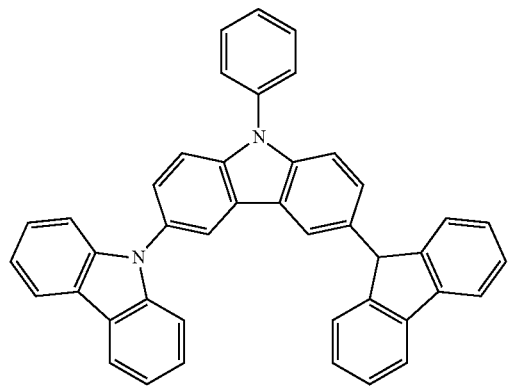

4-1

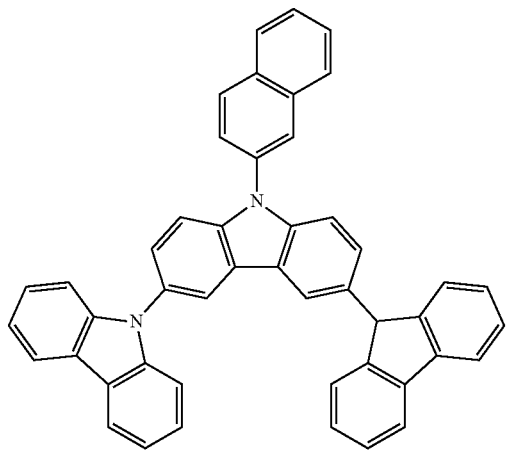

4-2

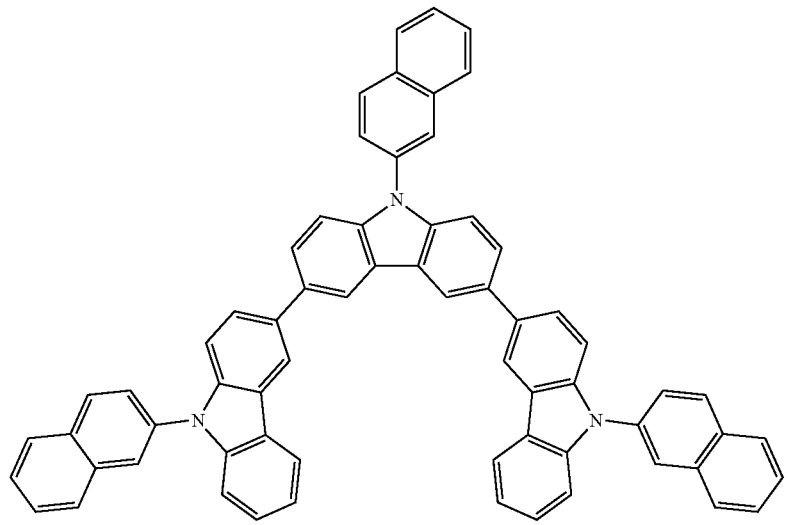

4-3

-continued
4-4
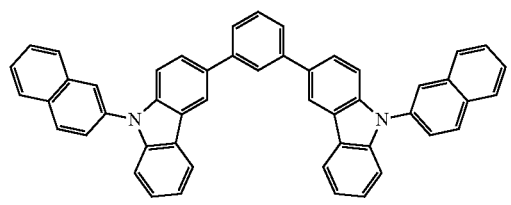
4-5
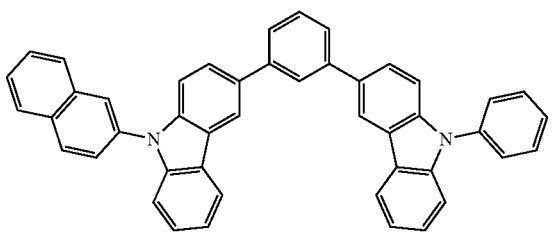
4-6
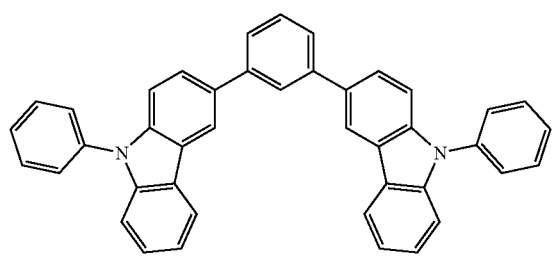
4-7
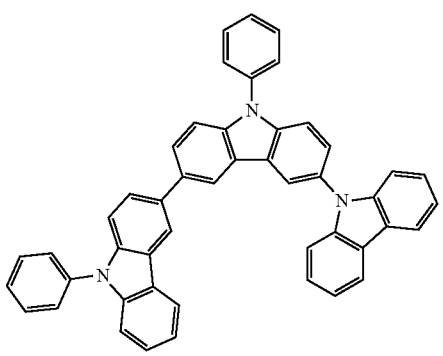
4-8
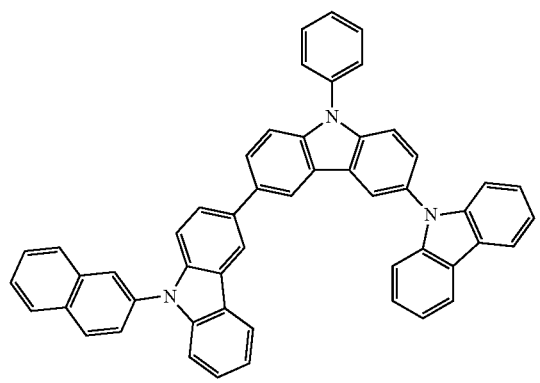
4-9
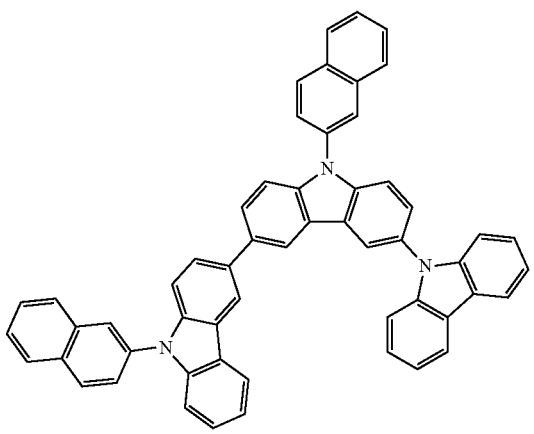
4-10
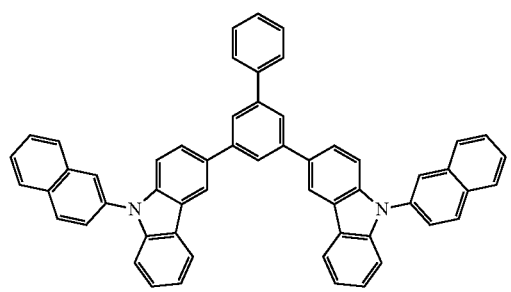
4-11
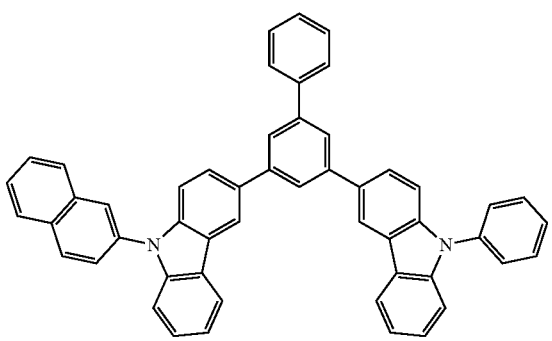

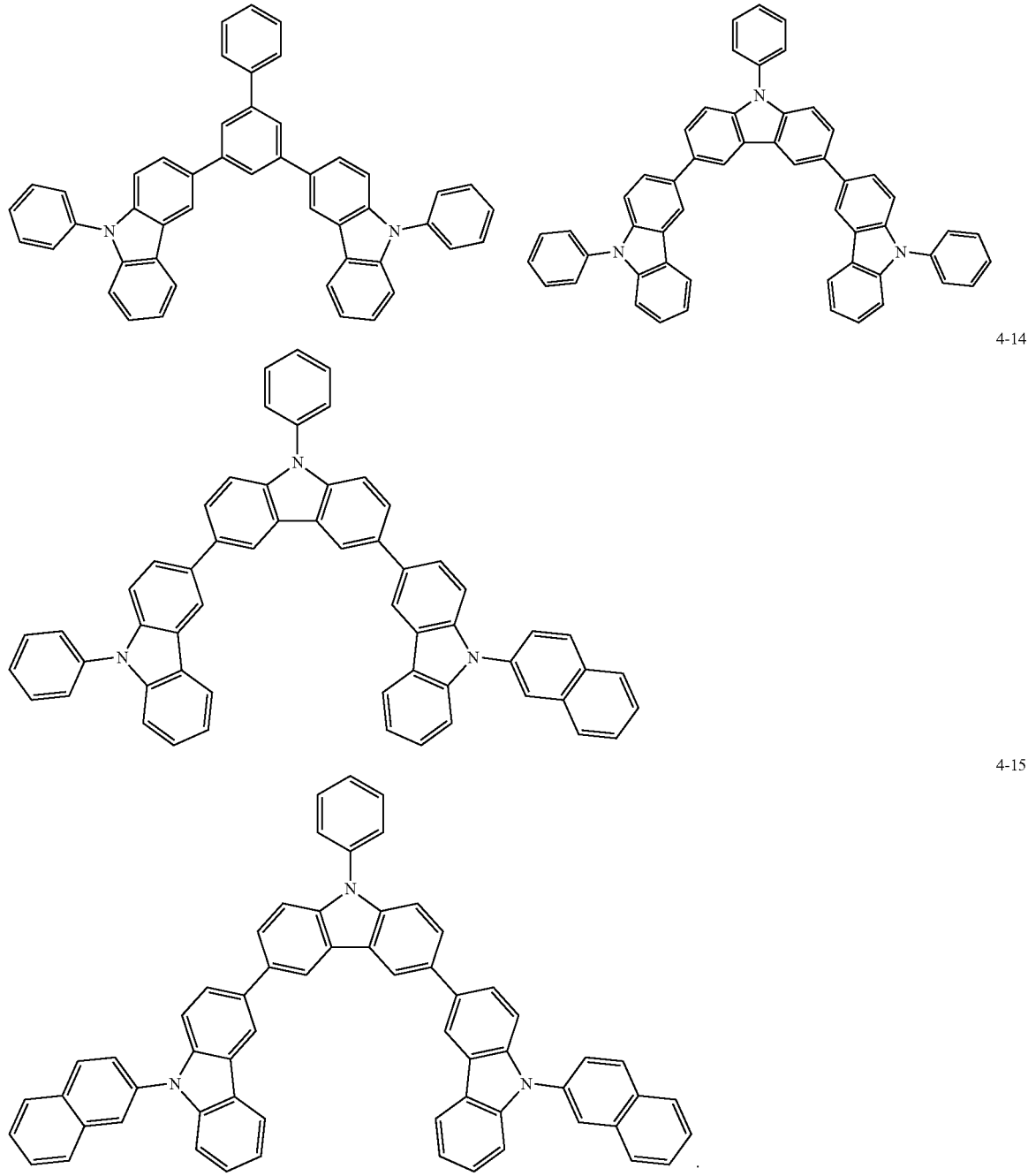

As described above, the HOMO energy level HOMO$^{DF}$ of the second compound DF as the delayed fluorescent material in the EML1 242 and the EML2 244 and the HOMO energy level HOMO$^{EBL}$ of the EBL 265 should satisfy the relationship in Equation (1). When those HOMO energy level relationships are not satisfied, charge transport or charge trap issues may be occurred.

Figure 4:
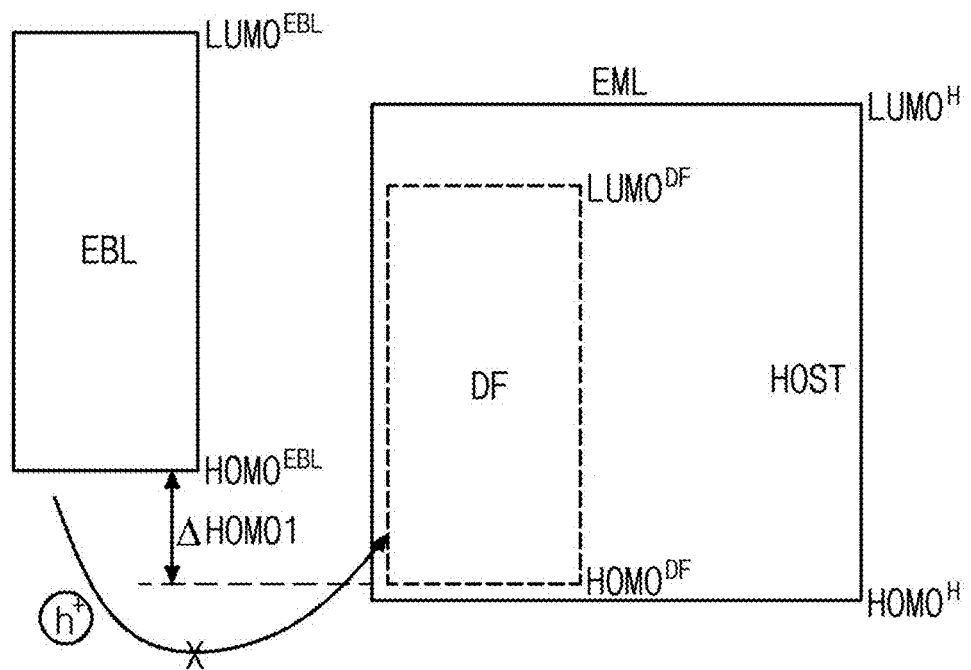
FIG. 4 is a schematic diagram illustrating charge transporting issues by the HOMO energy level bandgap between the EML and the EBL in one comparative example.

FIG. 4 is a schematic diagram illustrating charge transporting issues by the HOMO energy level bandgap between the EML and the EBL in one comparative example where the EML 240 includes the carbazole-based delayed fluorescent material having the structure of Chemical Formulae 1 and 2 as the second compound DF and the EBL 265 includes the (hetero) aromatic amino-based compound having the structure of Chemical Formulae 5 and 6.

As illustrated in FIG. 4, a LUMO (Lowest Unoccupied Molecular Orbital) energy level LUMO$^{EBL}$ of the EBL 265 is shallower than each of LUMO energy levels LUMO$^{H}$ and LUMO$^{DF}$ of the first and second compounds H and DF in the EML 240, thus electrons may be blocked efficiently at the EBL 265. On the other hand, when the EML 240 includes the carbazole-based organic compound having the structure of Chemical Formulae 1 and 2 as the delayed fluorescent material (second compound, DF) and the EBL 265 includes the (hetero) aromatic amino-based compound having the structure of Chemical Formulae 5 and 6, energy bandgap ΔHOMO1 between the HOMO energy level HOMOEBL of the EBL 265 and the HOMO energy level $HOMO^{DF}$ of the second compound DF as the delayed fluorescent material in the EML 240 is very large, i.e., more than or equal to about 0.4 eV. In this case, positive charged carriers, holes are not transferred from the EBL 265 to the first compound H as the host and the second compound DF as the delayed fluorescent material in the EML 240, but holes are accumulated at an interface between the EBL 265 and the EML 240. As holes are accumulated at the interface between the EBL 265 and the EML 240, the driving voltage of the OLED D increases. As the holes are quenched as non-emission without forming excitons and involving the luminescence process, the luminous efficiency and luminous lifetime of the OLED D decrease.

Figure 5:
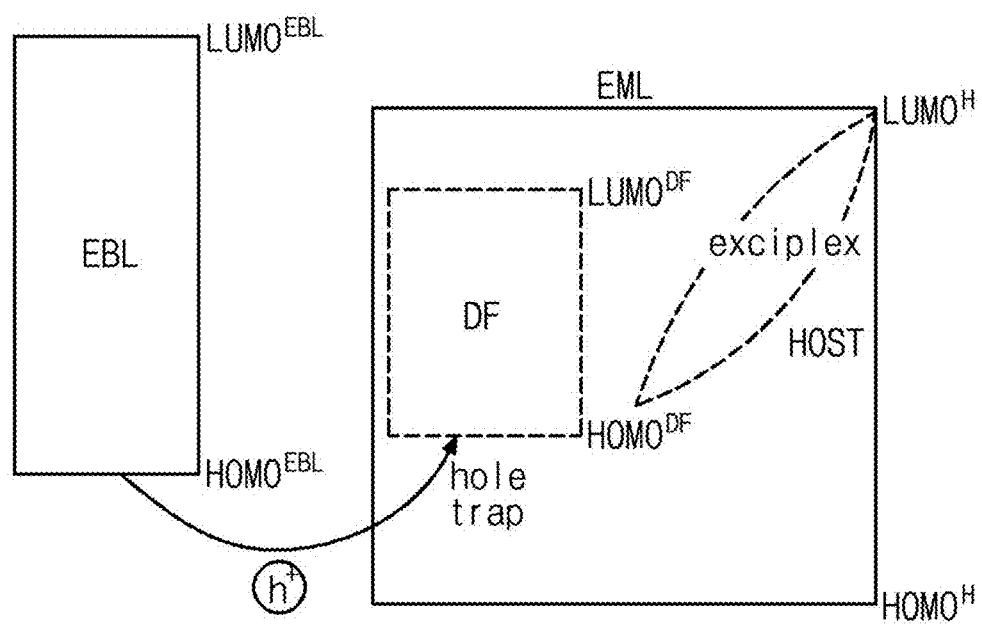
FIG. 5 is a schematic diagram illustrating charge trap issues by the HOMO energy level bandgap between the EML and the EBL in another comparative example.

FIG. 5 is a schematic diagram illustrating charge trap issues by the HOMO energy level bandgap between the EML and the EBL in another comparative example where the EML 240 includes the triazine-based delayed fluorescent material having the structure of Chemical Formulae 3 and 4 as the second compound and the EBL 265 includes the carbazole-based organic compound having the structure of Chemical Formulae 7 and 8. In this case, the HOMO energy level $HOMO^{DF}$ of the second compound DF as the delayed fluorescent material in the EML 240 is shallower than the HOMO energy level $HOMO^{EBL}$ of the carbazole-based organic compound in the EBL 265. Holes are transferred directly from the EBL 265 to the second compound DF as the delayed fluorescent material without via the first compound as the host in the EML 240, and therefore, the holes are trapped at the second compound DF. As the holes trapped at the second compound DF and electrons trapped at the first compound H form exciplex, the driving voltage of the OLED D increase while the luminous lifetime of the OLED D is deteriorated.

FIG. 6 is a schematic diagram illustrating charge injection without any charge transporting issues or charge trap issues by controlling the HOMO energy level bandgap between the EML and the EBL in the present disclosure where the EML 240 includes the carbazole-based delayed fluorescent material having the structure of Chemical Formulae 1 and 2 as the second compound DF and the EBL 265 includes the carbazole-based organic compound having the structure of Chemical Formulae 7 and 8, or the EML 240 includes the triazine-based delayed fluorescent material having the structure of Chemical Formulae 3 and 4 as the second compound DF and the EBL 265 includes the (hetero) aromatic amino-based organic compound having the structure of Chemical Formulae 5 and 6.

In this case, a energy bandgap ΔHOMO2 between the HOMO energy level $HOMO^{DF}$ of the second compound DF as the delayed fluorescent material in the EML 240 and the HOMO energy level HOMOEBL of the EBL 265 can satisfy the relationship in Equation (1). Holes can be transferred and injected rapidly from the EBL 265 to the second compound DF via the first compound H in the EML 240. Since the driving voltage of the OLED D is decreased and the recombination zone among holes and electrons are shifted toward the central region of the EML 240, it is possible to minimize reduction of the luminous efficiency and luminous lifetime of the OLED D owing to exciton losses.

Example 1 (Ex. 1): Fabrication of OLED

An OLED in which the compound 3-4 (LUMO −2.2 eV; HOMO −5.5 eV) in Chemical Formula 5 is applied to an EBL and mCBP (LUMO −2.5 eV; HOMO −6.0 eV) as a host and compound 2-2 (LUMO: −3.0 eV; HOMO: −5.6 eV) in Chemical Formula 4 as the delayed fluorescent material are applied into EML1 and EML2 was fabricated. An ITO (50 nm) attached glass substrate was washed ozone and was loaded into the vapor system, and then was transferred to a vacuum deposition chamber in order to deposit other layers on the substrate. An organic layer was deposited by evaporation by a heated boat under $10^{-7}$ torr with setting deposition rate 1 Å/s in the following order:

ITO (50 nm); a HIL (HAT-CN; 10 nm); a HTL (NPB, 75 nm); an EBL (compound 3-4, 15 nm); EML1 (mCBP (80 wt %): compound 2-2 (20 wt %), 5 nm); EML2 (mCBP (60 wt %): compound 2-2 (40 wt %), 40 nm); a HBL (B3PYMPM, 10 nm); a ETL (TPBi, 25 nm); an EIL (LIF); and a cathode (Al).

And then, cappling layer (CPL) was deposited over the cathode and the device was encapsualted by glass. After deposition of emissive layer and the cathode, the OLED was transferred from the deposition chamber to a dry box for film formation, followed by encapsulation using UV-curable epoxy resin and moisture getter.

Example 2 (Ex. 2): Fabrication of OLED

An OLED was fabricated using the same materials as Example 1, except that compound 4-1 (LUMO −2.3 eV; HOMO −5.7 eV) in Chemical Formula 8 in the EBL instead of compound 3-4 and compound 1-23 (LUMO −3.4 eV; HOMO −5.9 eV) in Chemical Formula 2 as the delayed fluorescent material in the EML1 and EML2 instead of compound 2-2 were used and the concentration of the compound 1-23 in the EML1 was modified to 5 wt %.

Examples 3-8 (Ex. 3-8): Fabrication of OLED

An OLED was fabricated using the same materials as Example 2, except that the concentrations of the compound 1-23 as the delayed fluorescent material in the EML1 were modified to 10 wt % (Ex. 3), 15 wt % (Ex. 4), 20 wt % (Ex. 5), 25 wt % (Ex. 6), 30 wt % (Ex. 7) or 35 wt % (Ex. 8).

Example 9 (Ex. 9): Fabrication of OLED

An OLED was fabricated using the same materials as Example 1, except that compound 3-1 (LUMO −2.3 eV; HOMO −5.5 eV) in Chemical Formula 6 in the EBL instead of compound 3-4.

Example 10 (Ex. 10): Fabrication of OLED

An OLED was fabricated using the same materials as Example 5, except that compound 4-12 (LUMO −2.2 eV; HOMO −5.7 eV) in Chemical Formula 8 in the EBL instead of compound 4-1.

Comparative Example 1 (Ref. 1): Fabrication of OLED

An OLED was fabricated using the same materials as Example 1, except that compound 3-4 (LUMO −2.2 eV; HOMO −5.5 eV) in the EBL instead of compound 3-4 was used, and single EML (mCBP (host, 60 wt %): compound 1-23 (delayed fluorescent material, 40 wt %; LUMO −3.4 eV; HOMO −5.9 eV), 40 nm) instead of double EMLs was applied.

Comparative Example 2 (Ref. 2): Fabrication of OLED

An OLED was fabricated using the same materials as Ref 1, except that compound 2-2 (LUMO −3.0 eV; HOMO −5.6 eV) as the delayed fluorescent material in the single EML instead of compound 1-23.

Comparative Example 3 (Ref 3): Fabrication of OLED

An OLED was fabricated using the same materials as Ref 1, except that compound 4-1 (LUMO −2.3 eV; HOMO −5.7 eV) in the EBL was used instead of compound 3-4.

Comparative Example 4 (Ref 4): Fabrication of OLED

An OLED was fabricated using the same materials as Ref 3, except that compound 2-2 as the delayed fluorescent material in the single EML was used instead of compound 1-23.

Comparative Example 5 (Ref. 5): Fabrication of OLED

An OLED was fabricated using the same materials as Ex. 1, except that compound 1-23 (LUMO −3.4 eV; HOMO −5.9 eV) as the delayed fluorescent material in the EML1 and EML2 was used instead of compound 2-2.

Comparative Examples 6-9 (Ref 6-9): Fabrication of OLED

An OLED was fabricated using the same materials as Example 2, except that the concentrations of the compound 1-23 as the delayed fluorescent material in the EML1 were modified to 5 wt % (Ref. 6), 50 wt % (Ref. 7), 60 wt % (Ref. 8) or 70 wt % (Ref. 9).

Comparative Example 10 (Ref. 10): Fabrication of OLED

An OLED was fabricated using the same materials as Ex. 1, except that compound 4-1 (LUMO −2.3 eV; HOMO −5.7 eV) in the EBL was used instead of compound 3-4.

Comparative Example 11 (Ref. 11): Fabrication of OLED

An OLED was fabricated using the same materials as Ref 2, except that the concentration of compound 1-23 in the EML1 (40 nm) was modified to 40 wt % and the concentration of compound 1-23 in the EML2 (5 nm) was modified to 10 wt %.

Comparative Example 12 (Ref. 12): Fabrication of OLED

An OLED was fabricated using the same materials as Ref. 11, except that the concentration of compound 1-23 in the EML2 was modified to 70 wt %.

Comparative Example 13 (Ref. 13): Fabrication of OLED

An OLED was fabricated using the same materials as Ex. 2, except that triple EMLs, i.e. EML1 (mCBP as host (80 wt %): compound 1-23 as delayed fluorescent material (20 wt %), 13 nm), EML2 (mCBP (70 wt %): compound 1-23 (30 wt %), 13 nm) and EML3 (mCBP (60 wt %): compound 1-23 (40 wt %), 13 nm) instead of double EMLs.

Comparative Example 14 (Ref. 14): Fabrication of OLED

An OLED was fabricated using the same materials as Ref. 13, except that the concentrations of the compounds 1-23 in each of the EML1, EML2 and EML3 were modified 40 wt %, 30 wt % and 20 wt %, respectively.

Experimental Example 1: Measurement of Luminous Properties of OLED

Each of the OLED fabricated by Ex. 1-10 and Ref. 1-15 was connected to an external power source and then luminous properties for all the diodes were evaluated using a constant current source (KEITHLEY) and a photometer PR650 at room temperature. In particular, driving voltage (V), current efficiency (cd/A), power efficiency (lm/W), maximum electroluminescence wavelength (EL $\lambda_{max}$, nm), external quantum efficiency (EQE, %) and $T_{95}$ (time period of 95% luminance from initial luminance, hours) at 6.3 mA/m² current density were measured. The results thereof are shown in the following Tables 1 and 2.

TABLE 1

Luminous Properties of OLED

| Sample | V | cd/A | lm/W | EL $\lambda_{max}$ | EQE (%) | $T_{95}$ (hr) |
|---|---|---|---|---|---|---|
| Ref. 1 | 4.4 | 61.9 | 44.4 | 538 | 15.6 | 56 |
| Ref. 2 | 3.5 | 50.8 | 45.9 | 526 | 16.1 | 103 |
| Ref. 3 | 4.2 | 62.3 | 46.6 | 538 | 17.1 | 120 |
| Ref. 4 | 3.9 | 53.2 | 42.8 | 526 | 15.5 | 64 |
| Ref. 5 | 4.3 | 54.4 | 39.5 | 536 | 15.9 | 89 |
| Ref. 6 | 4.2 | 68.6 | 51.3 | 536 | 18.4 | 135 |
| Ref. 7 | 4.3 | 59.6 | 43.6 | 538 | 17.0 | 102 |
| Ref. 8 | 4.5 | 51.9 | 36.2 | 538 | 14.8 | 88 |
| Ref. 9 | 4.6 | 39.6 | 26.9 | 540 | 12.1 | 85 |
| Ref. 10 | 3.9 | 49.1 | 39.6 | 524 | 15.2 | 68 |
| Ref. 11 | 4.4 | 52.4 | 37.8 | 532 | 15.2 | 76 |
| Ref. 12 | 4.6 | 53.0 | 37.0 | 540 | 14.8 | 90 |
| Ref. 13 | 4.1 | 33.6 | 25.1 | 536 | 18.0 | 101 |
| Ref. 14 | 4.5 | 42.2 | 29.6 | 540 | 15.5 | 92 |

TABLE 2

Luminous Properties of OLED

| Sample | V | cd/A | lm/W | $\lambda_{max}$ | EQE (%) | $T_{95}$ (hr) |
|---|---|---|---|---|---|---|
| Ex. 1 | 3.2 | 53.1 | 52.1 | 524 | 17.8 | 186 |
| Ex. 2 | 4.1 | 69.1 | 52.9 | 534 | 19.1 | 215 |
| Ex. 3 | 4.0 | 69.7 | 54.6 | 534 | 19.5 | 238 |
| Ex. 4 | 4.0 | 68.8 | 54.0 | 534 | 20.0 | 266 |
| Ex. 5 | 4.0 | 69.9 | 54.3 | 534 | 20.3 | 284 |
| Ex. 6 | 4.0 | 67.9 | 53.3 | 534 | 19.9 | 227 |
| Ex. 7 | 4.1 | 70.5 | 53.6 | 536 | 19.3 | 190 |
| Ex. 8 | 4.1 | 69.2 | 53.0 | 536 | 19.0 | 185 |
| Ex. 9 | 3.3 | 54.0 | 51.4 | 524 | 17.4 | 180 |
| Ex. 10 | 4.0 | 68.2 | 53.5 | 534 | 19.9 | 276 |

As indicated in Tables 1 and 2, compared to the OLEDs in which single EML has high concentration (40 wt %) of the delayed fluorescent material in Ref. 1-4, the OLEDs in Ex. 1-10 lowered their driving voltage up to 27.3% and enhanced their current efficiency, power efficiency, EQE and luminous lifetime ($T_{95}$) up to 38.8%, 27.6%, 29.0% and 407.1%, respectively. Also, compared to the OLEDs in which HOMO energy levels between the EBL and the delayed fluorescent materials are not controlled in Ref 5 and Ref. 10, the OLEDs in Ex. 1-10 lowered their driving voltage up to 25.6% and enhanced their current efficiency, power efficiency, EQE and luminous lifetime ($T_{95}$) up to 43.6%, 38.2%, 33.6% and 317.6%, respectively. In addition, compared to the OLEDs in which EML1 has high concentration (40 wt % or more) of the delayed fluorescent materials in Ref 6-9 and Ref 11-12, the OLEDs in Ex. 1-10 lowered their driving voltage up to 30.4% and enhanced their current efficiency, power efficiency, EQE and luminous lifetime ($T_{95}$) up to 78.0%, 103.0%, 67.8% and 273.7%, respectively. Moreover, compared to the OLEDs in which three EMLs have different thicknesses and gradually increased concentrations of the delayed fluorescent materials in Ref. 13-14, the OLEDs in Ex. 1-10 lowered their driving voltage up to 28.9% and enhanced their current efficiency, power efficiency, EQE and luminous lifetime ($T_{95}$) up to 109.8%, 117.5%, 31.0% and 208.7%, respectively.

It will be apparent to those skilled in the art that various modifications and variations can be made in the organic light emitting diode (OLED) and the organic light emitting device including the OLED of the present disclosure without departing from the scope of the disclosure. Thus, it is intended that the present disclosure cover the modifications and variations of the present disclosure provided they come within the scope of the appended claims.

What is claimed is:

1. An organic light emitting diode, comprising:
a first electrode;
a second electrode facing the first electrode;
a first emitting material layer disposed between the first and second electrodes;
a second emitting material layer disposed between the first emitting material layer and the second electrode; and
an electron blocking layer disposed between the first electrode and the first emitting material layer,
wherein each of the first emitting material layer and the second emitting material layer consists of a first compound and a second compound that is a delayed fluorescent material,
wherein a level of the delayed fluorescent material in the first emitting material is higher than a level of the delayed fluorescent material in the second emitting material layer,
wherein a HOMO (Highest Occupied Molecular orbital) energy level ($HOMO^{DF}$) of the second compound and a HOMO energy level ($HOMO^{EBL}$) of the electron blocking layer satisfy the following relationship in Equation (1):

$$0\ eV < HOMO^{EBL} - HOMO^{DF} < 0.4\ eV \qquad (1);$$

wherein the first emitting material layer and the second emitting material layer are disposed within a single emitting unit,
wherein an excited triplet energy level of the first compound is higher than an excited triplet energy level of the second compound in the first emitting material layer and the second emitting material layer,
wherein the level of the delayed fluorescent material in the first emitting material layer is between 10% by weight and 35% by weight,
wherein the delayed fluorescent material includes compound 1-23:

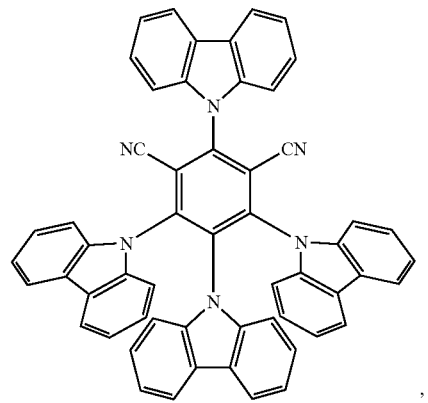

1-23 and
wherein the electron blocking layer comprises an organic compound selected from:

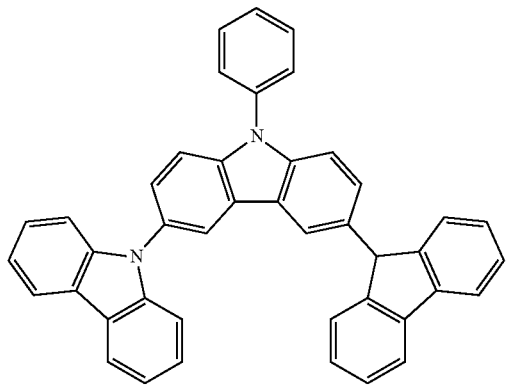

4-1

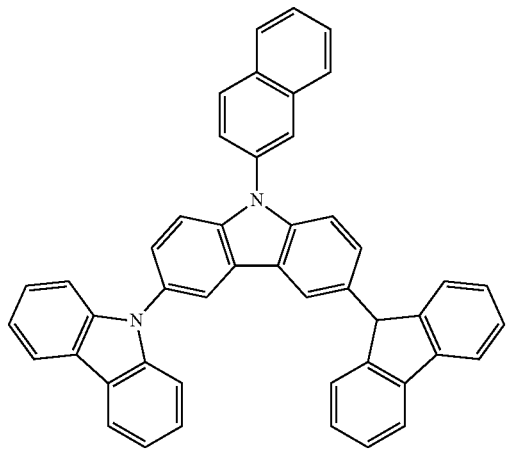

4-2

4-3
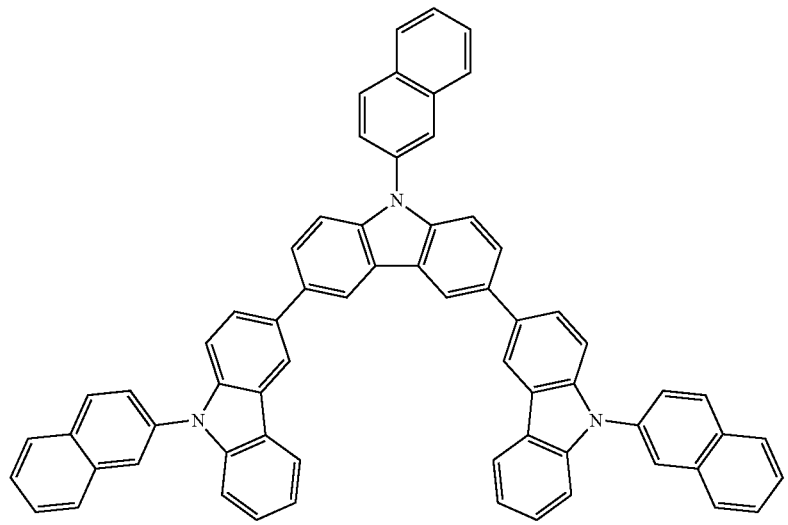
4-4
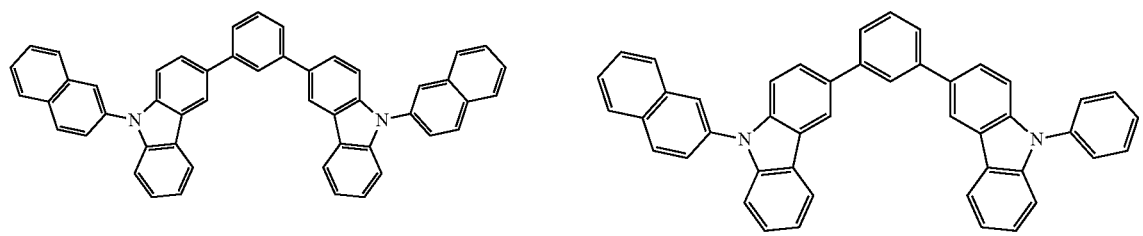
4-5
4-6
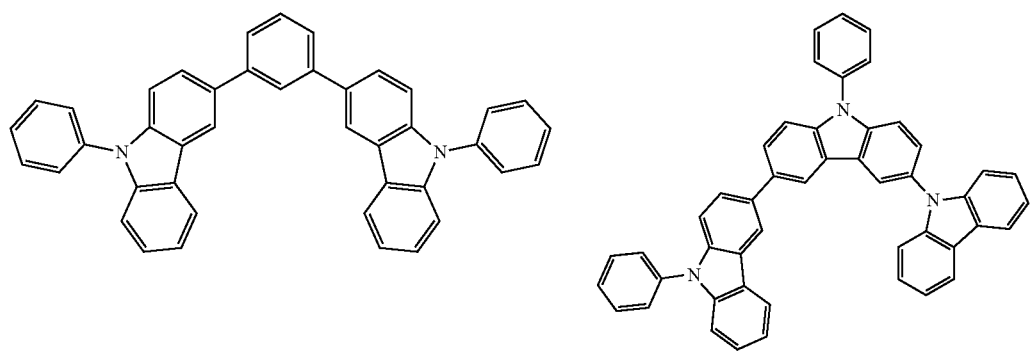
4-7
4-8
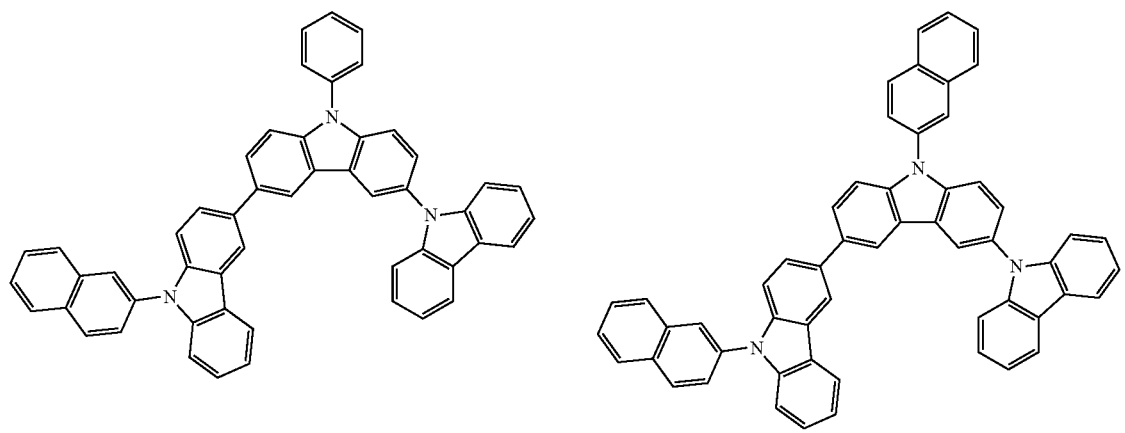
4-9

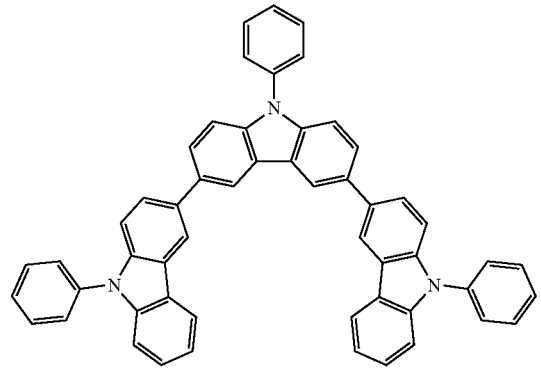
4-13

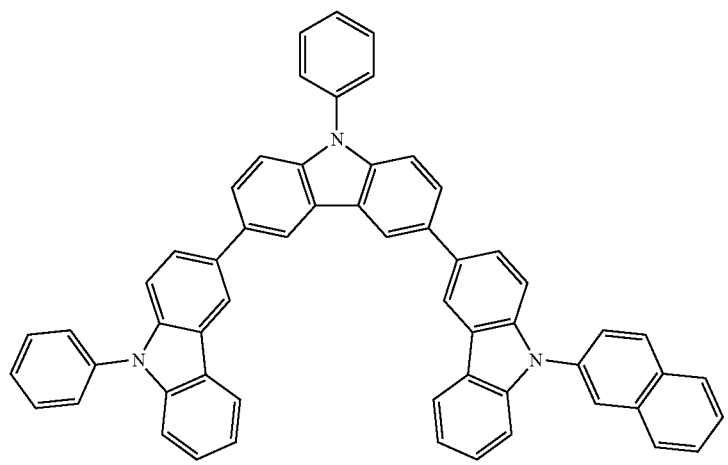
4-14

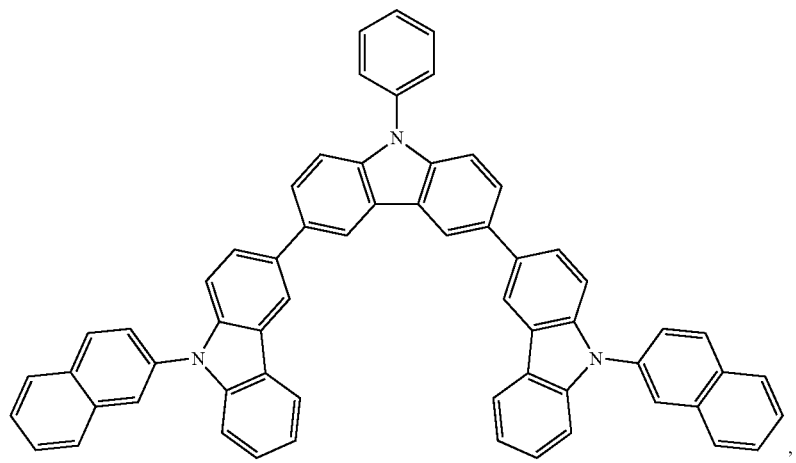
4-15 and
wherein the first compound includes a compound selected from 9-(3-(9H-carbazol-9-yl) phenyl)-9H-carbazole-3-carbonitrile, Bis [2-(diphenylphosphino) phenyl] ether oxide, 2,8-bis (diphenylphosphoryl) dibenzothiophene), 2,6-Di (9H-carbazol-9-yl) pyridine), 3',5'-Di (carbazol-9-yl)-[1,1'-biphenyl]-3,5-dicarbonitrile, 4'-(9H-carbazol-9-yl) biphenyl-3,5-dicarbonitrile (4'-(9H-carbazol-9-yl) biphenyl-3,5-dicarbonitrile, 3'-(9H-carbazol-9-yl) biphenyl-3,5-dicarbonitrile, Diphenyl-4-triphenylsilylphenyl-phosphine oxide, 4-(3-(triphenylen-2-yl) phenyl) dibenzo [b,d]thiophene, 9-(4-(9H-carbazol-9-yl) phenyl)-9H-3,9'-bicarbazole, 9-(3-(9H-carbazol-9-yl) phenyl)-9H-3,9'-bicarbazole, and 9-(6-(9H-carbazol-9-yl) pyridin-3-yl)-9H-3,9'-bicabazole.

2. The organic light emitting diode of claim 1, wherein the first emitting material layer has a thickness thinner than a thickness of the second emitting material layer.

3. The organic light emitting diode of claim 1, wherein an excited singlet energy level of the first compound is higher than an exited singlet energy level of the second compound.

4. The organic light emitting diode of claim 1, wherein an excited singlet energy level of the first compound is higher than an exited singlet energy level of the second compound and an excited triplet energy level of the first compound is higher than an excited triplet energy level of the second compound.

5. The organic light emitting diode of claim 1, wherein the second emitting material layer directly contacts an upper surface of the first emitting material layer.

6. The organic light emitting diode of claim 1, wherein the organic compound in the electron blocking layer comprises any one selected from:

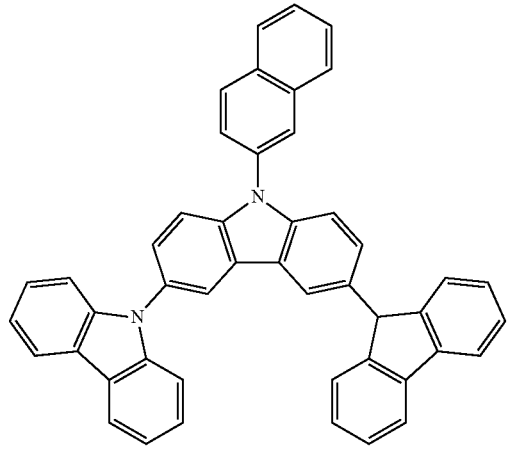

4-2

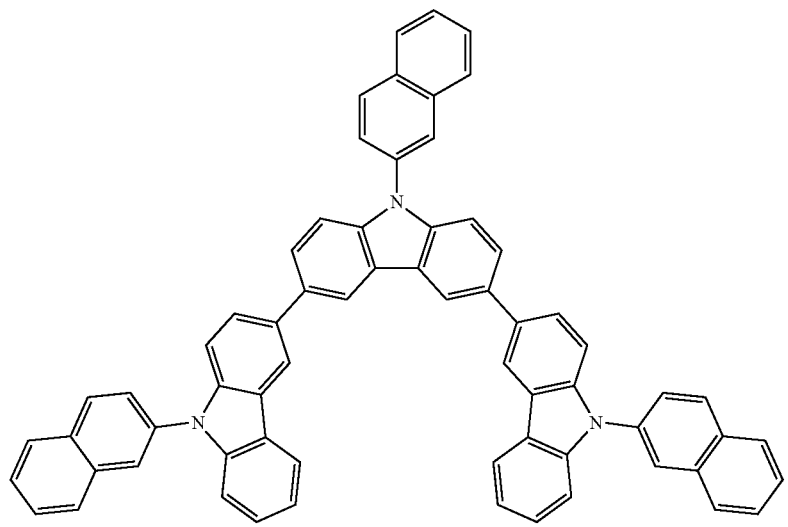

4-3

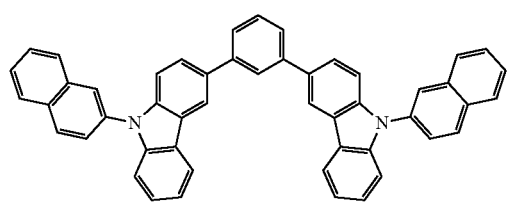

4-4

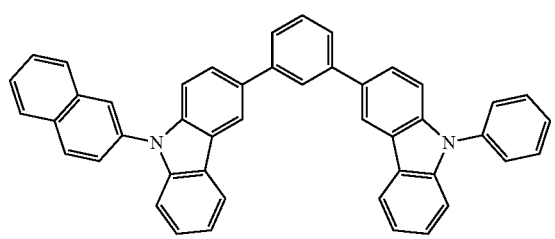

4-5

-continued
4-6
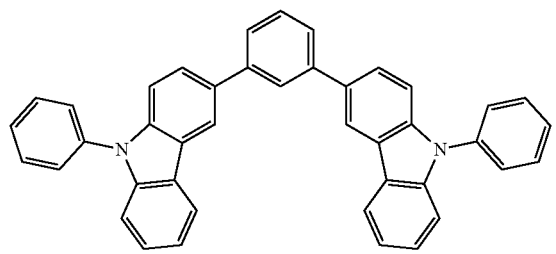
4-7
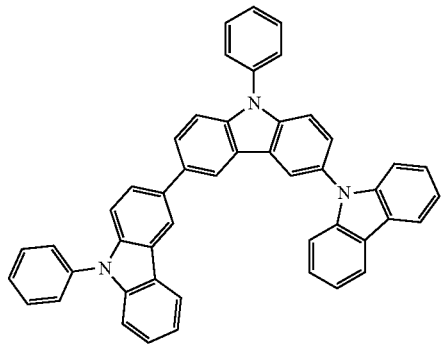
4-8
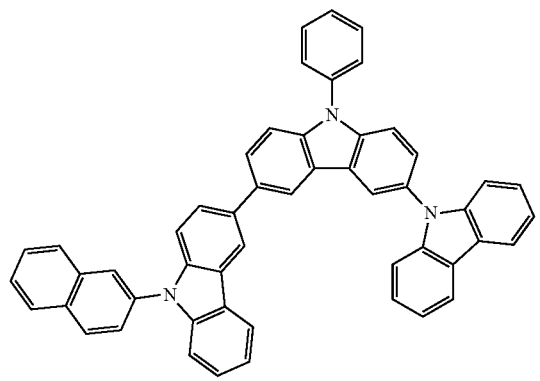
4-9
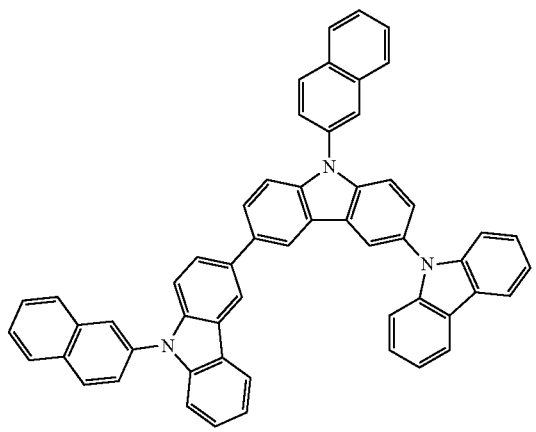
4-13
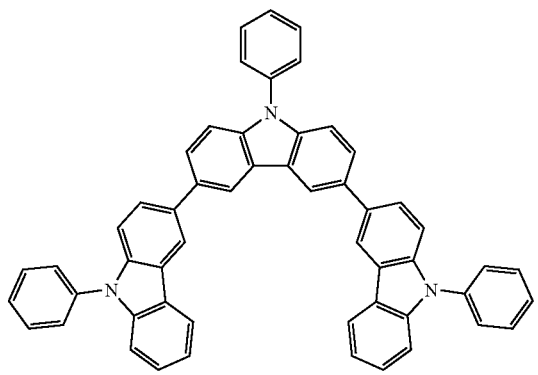

-continued
4-14
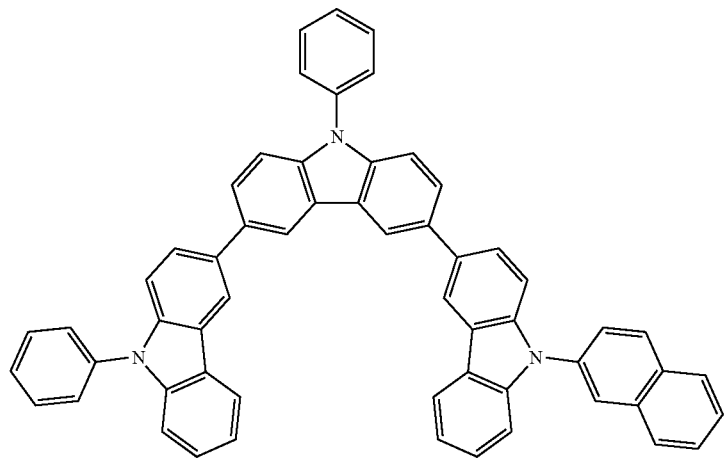
4-15
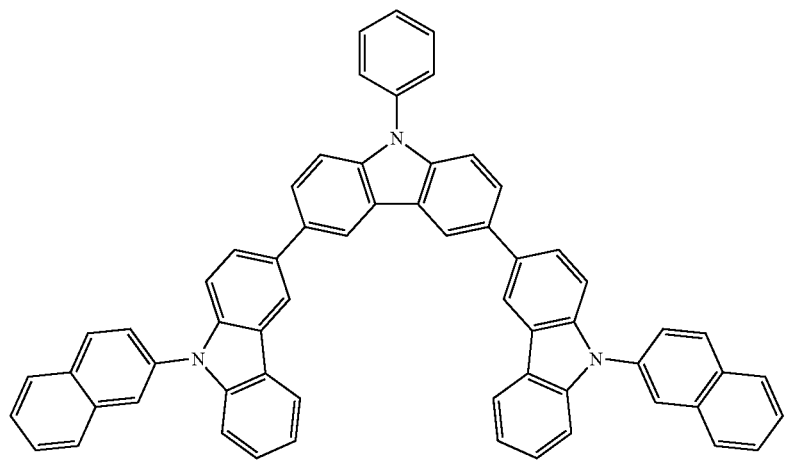
7. The organic light emitting diode of claim 1, wherein the organic compound in the electron blocking layer comprises:
4-1
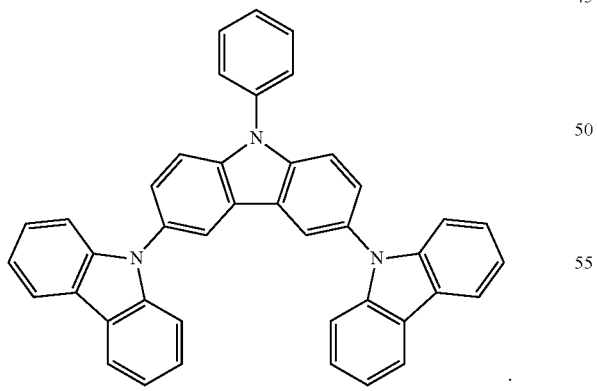
* * * * *